(12) United States Patent
Nakazawa et al.

(10) Patent No.: US 6,734,050 B2
(45) Date of Patent: May 11, 2004

(54) METHOD OF MANUFACTURING A CRYSTALLINE SEMICONDUCTOR FILM

(75) Inventors: Misako Nakazawa, Atsugi (JP); Toshiji Hamatani, Atsugi (JP); Naoki Makita, Nara (JP)

(73) Assignees: Semiconductor Energy Laboratory Co., Ltd., Kanagawa-ken (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/229,385

(22) Filed: Aug. 28, 2002

(65) Prior Publication Data

US 2003/0067004 A1 Apr. 10, 2003

(30) Foreign Application Priority Data

Aug. 30, 2001 (JP) ........................................ 2001-261695

(51) Int. Cl.$^7$ .............................................. H01L 21/84
(52) U.S. Cl. ........................ 438/151; 438/166; 438/486
(58) Field of Search ................................. 438/151, 153, 438/162, 166, 486, 782, 487

(56) References Cited

U.S. PATENT DOCUMENTS

| | | | |
|---|---|---|---|
| 5,643,826 A | | 7/1997 | Ohtani et al. |
| 5,728,626 A | * | 3/1998 | Allman et al. ............. 438/608 |
| 6,074,901 A | | 6/2000 | Ohtani et al. |
| 6,348,367 B1 | * | 2/2002 | Ohtani et al. ............... 438/151 |

FOREIGN PATENT DOCUMENTS

JP 07-211636 8/1995

* cited by examiner

Primary Examiner—Tuan H. Nguyen
(74) Attorney, Agent, or Firm—Eric J. Robinson; Robinson Intellectual Property Law Office, P.C.

(57) ABSTRACT

A spin addition method for catalyst elements is simple and very important technique, because the minimum amount of a catalyst element necessary for crystallization can be easily added by controlling the catalyst element concentration within a catalyst element solution, but there is a problem in that uniformity in the amount of added catalyst element within a substrate is poor. The non-uniformity in the amount of added catalyst element within the substrate is thought to influence fluctuation in crystallinity of a crystalline semiconductor film that has undergone thermal crystallization, and exert a bad influence on the electrical characteristics of TFTs finally structured by the crystalline semiconductor film. The present invention solves this problem with the aforementioned conventional technique. If the spin rotational acceleration speed is set low during a period moving from a dripping of the catalyst element solution process to a high velocity spin drying process in a catalyst element spin addition step, then it becomes clear that the non-uniformity of the amount of added catalyst element within the substrate is improved. The above stated problems are therefore solved by applying a spin addition process with a low spin rotational acceleration to a method of manufacturing a crystalline semiconductor film.

24 Claims, 16 Drawing Sheets

FIG. 3
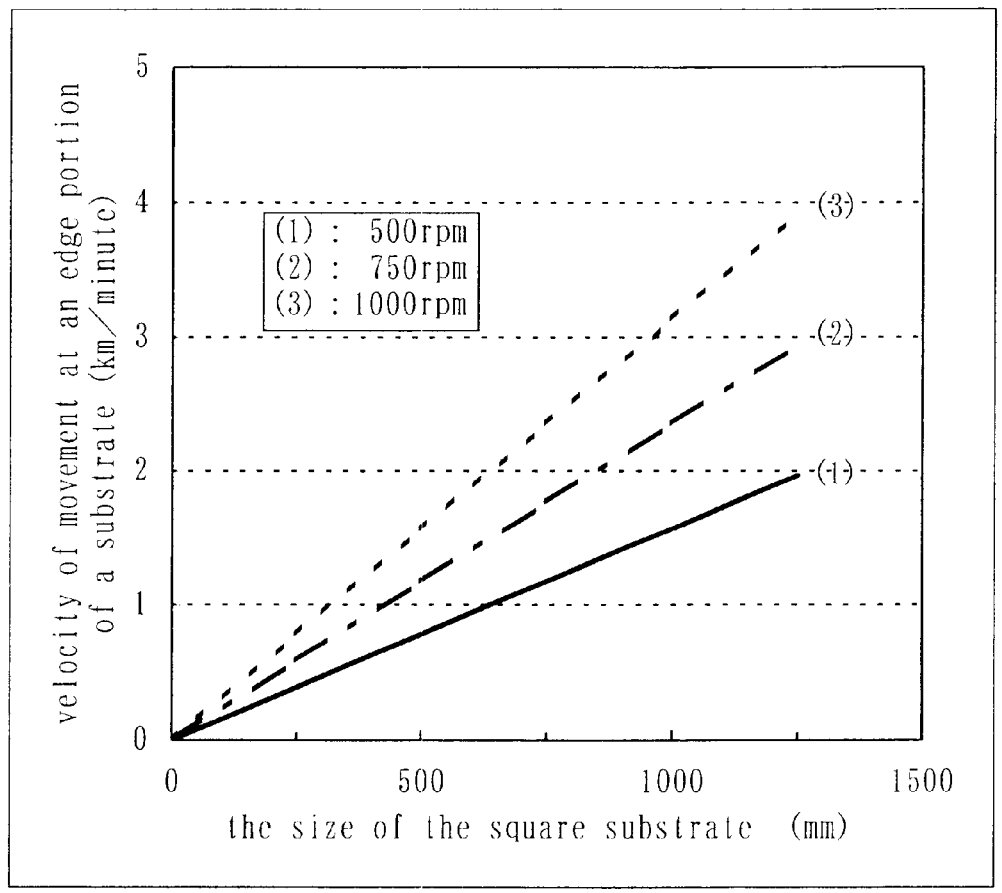
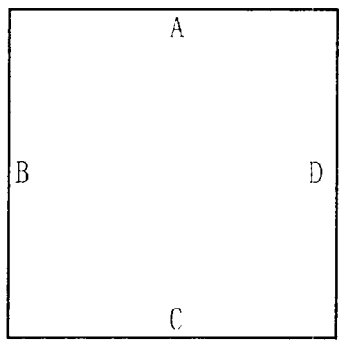
Edge portions of the substrate correspond to A-D in the square substrate.

FIG. 5A

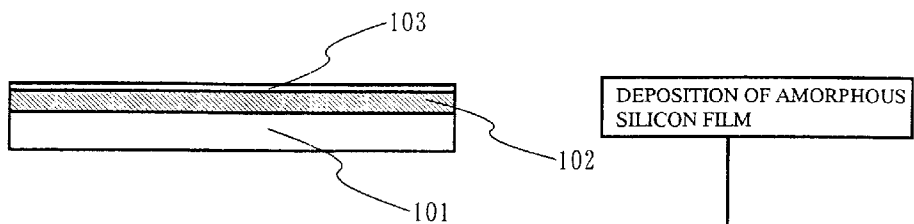

DEPOSITION OF AMORPHOUS SILICON FILM

FIG. 5B

REMOVAL OF NATURAL OXIDE FILM BY DILUTE HYDROFLUORIC ACID PROCESSING

FIG. 5C

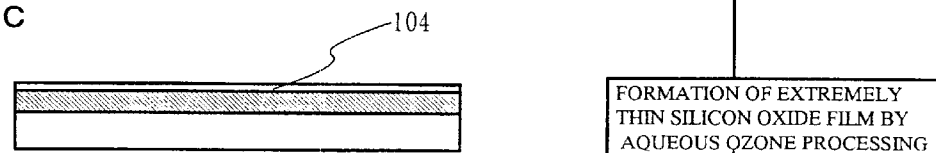

FORMATION OF EXTREMELY THIN SILICON OXIDE FILM BY AQUEOUS OZONE PROCESSING

FIG. 5D

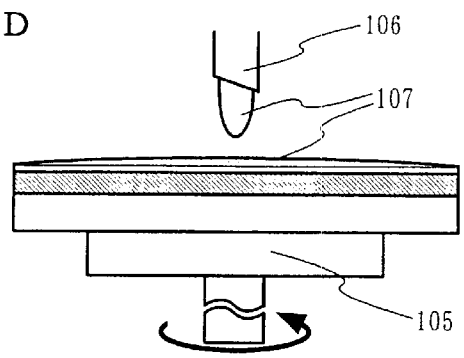

ADDITION OF AQUEOUS Ni ELEMENT SOLUTION BY SPIN ADDITION METHOD SPIN ADDITION IN LOW VELOCITY SPIN STATE OF 100 RPM

FIG. 5E

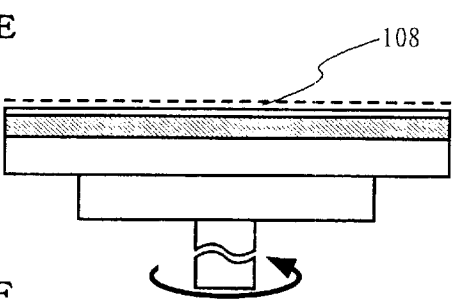

FORMATION OF Ni CONTAINING LAYER BY SPIN DRYING ACCELERATION TO 1200 RPM AT LOW ACCELERATION OF 30 RPM/SEC SPIN DRYING FOR 20 SEC AT 1200 RPM

FIG. 5F

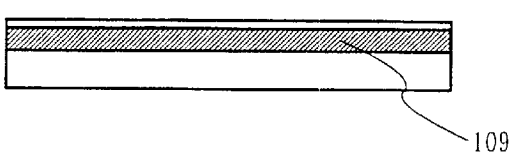

CRYSTALLIZATION OF AMORPHOUS SILICON FILM BY HEAT TREATMENT (VERTICAL GROWTH METHOD)

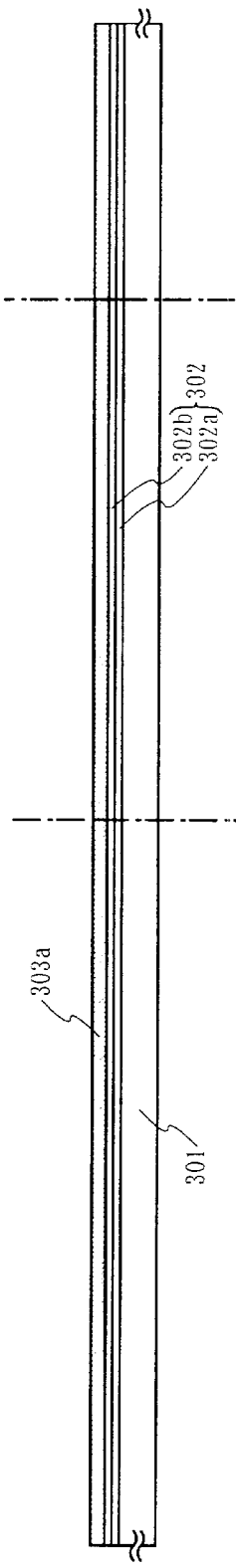
FIG. 7A  DEPOSITION OF AMORPHOUS SILICON FILM/PREPROCESS/ADDITION OF NI ELEMENT SOLUTION
ADDITION OF NI ELEMENT SOLUTION
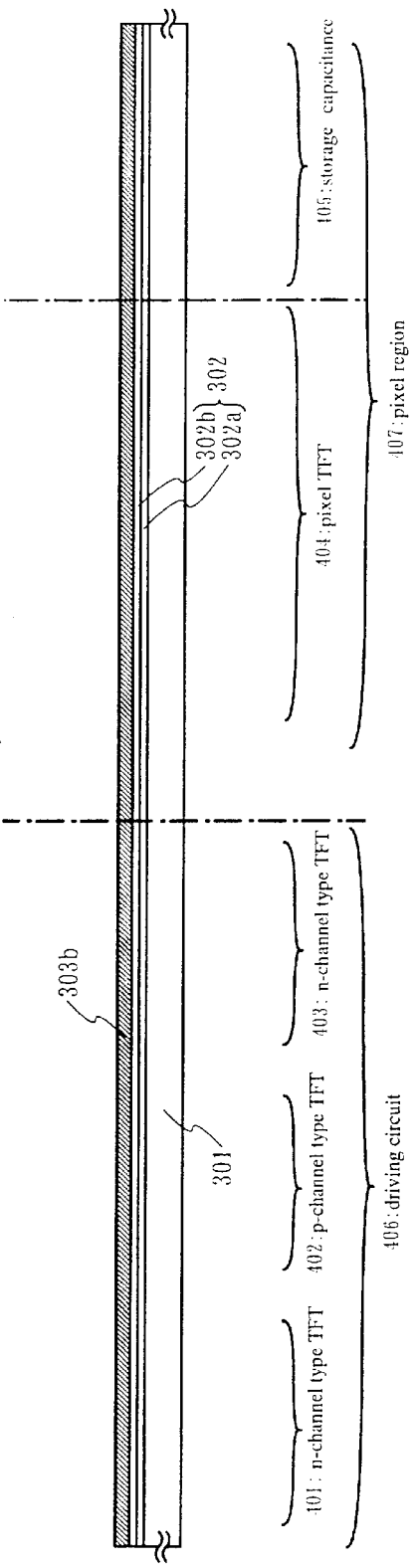
FIG. 7B  DEHYDROGENATION/ TERMAL CRYSTALLIZATION(HEAT TREATMENT/IN THE ELECTROTHERMAL
FURNACE+LASER IRRADIATION TREATMENT)

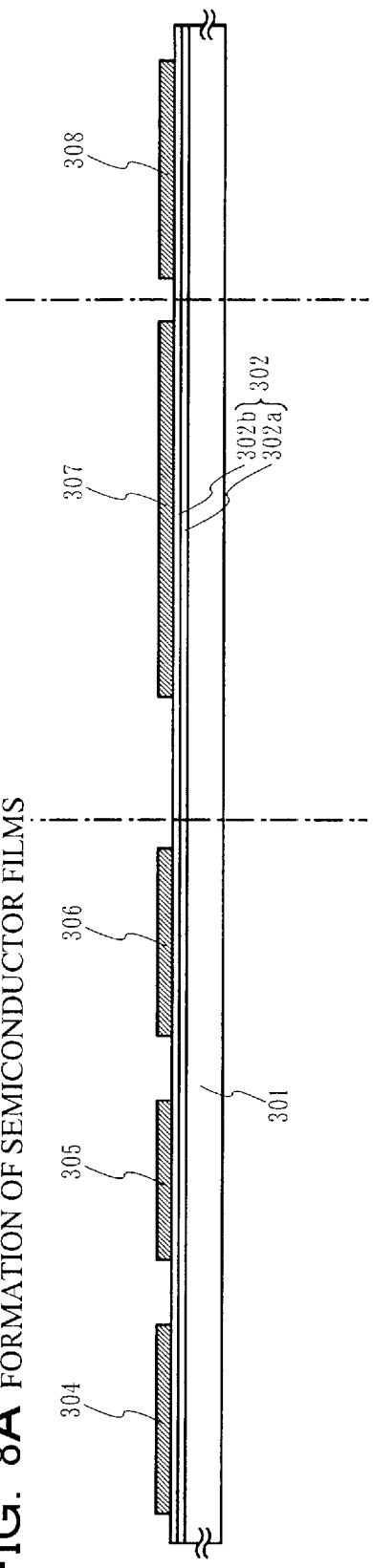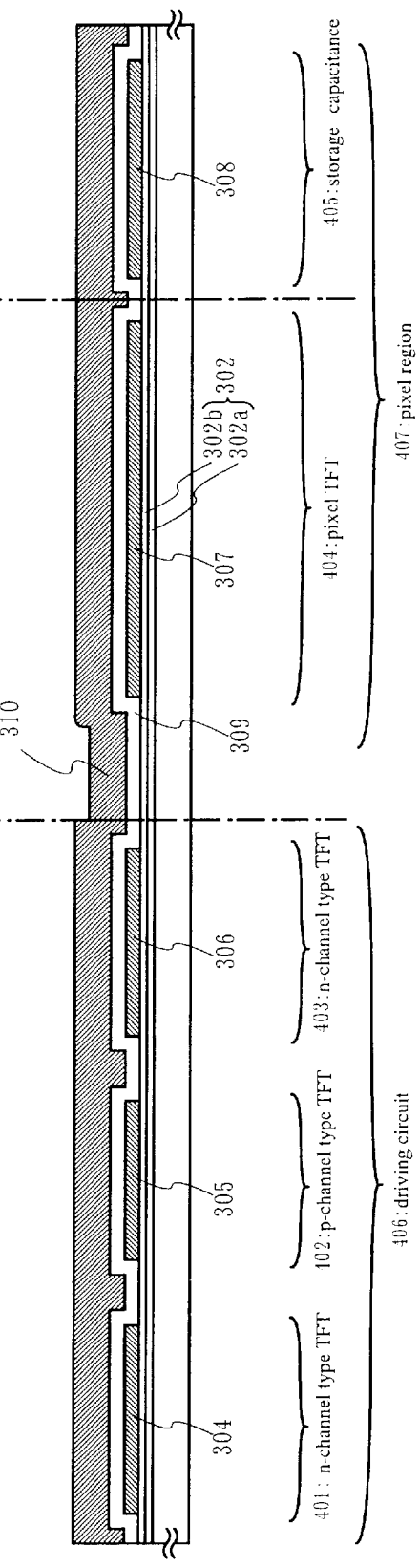
FIG. 8A FORMATION OF SEMICONDUCTOR FILMS
FIG. 8B DEPOSITING THE GATE INSULATING FILM/DEPOSITING THE GATE ELECTRODE

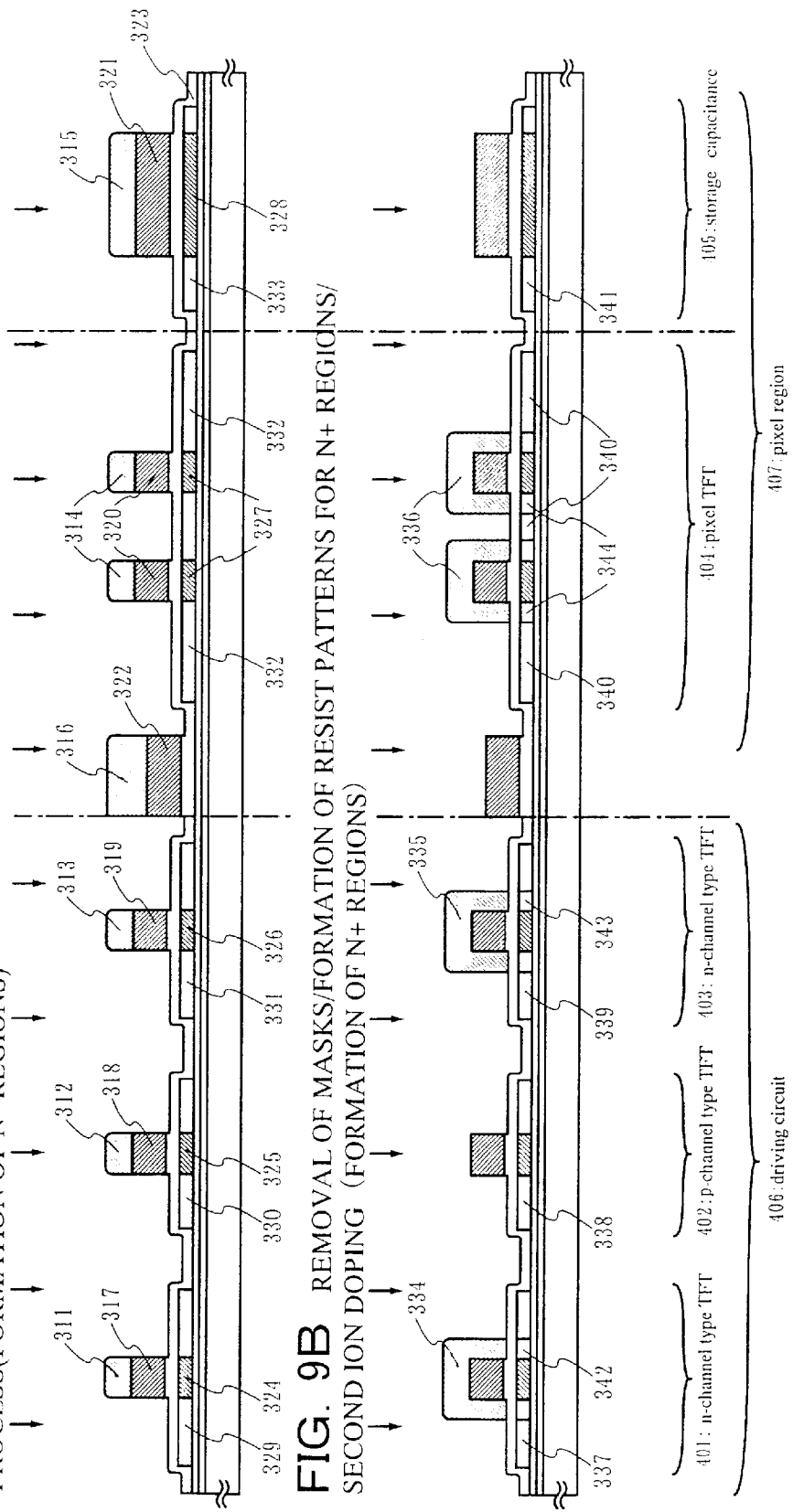

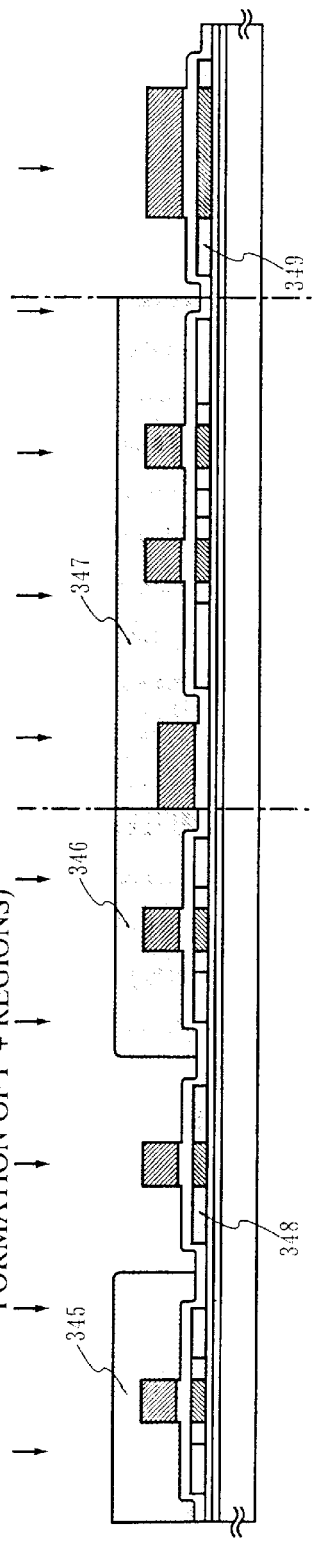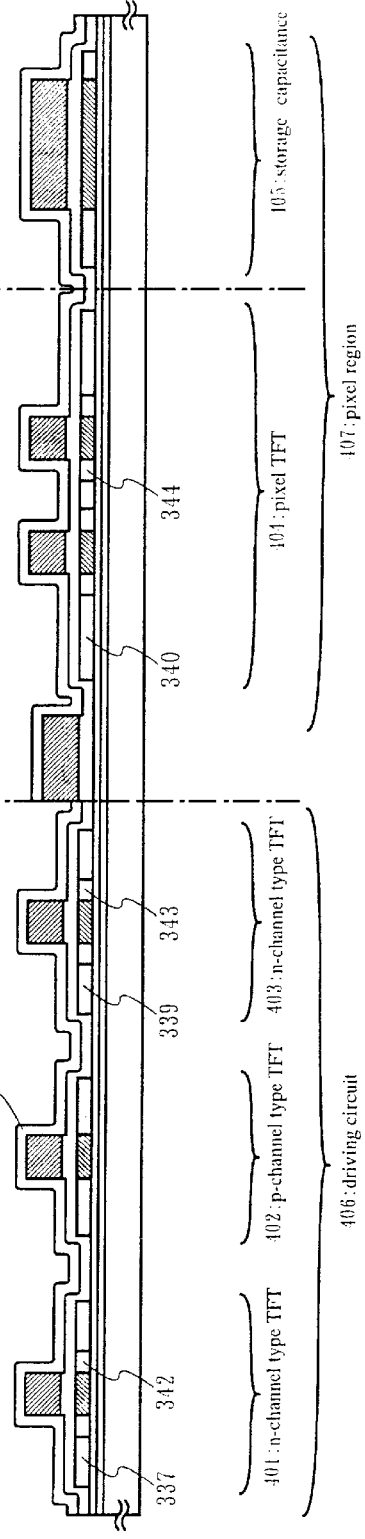
FIG. 10A REMOVAL OF MASKS(FORMATION OF RESIST PATTERNS FOR for P+ REGIONS/THIRD ION DOPING/ FORMATION OF P + REGIONS)
FIG. 10B REMOVAL OF RESIST/DEPOSITION OF FIRST INTERLAYER INSULATING FILM/THERMAL ACTIVATION

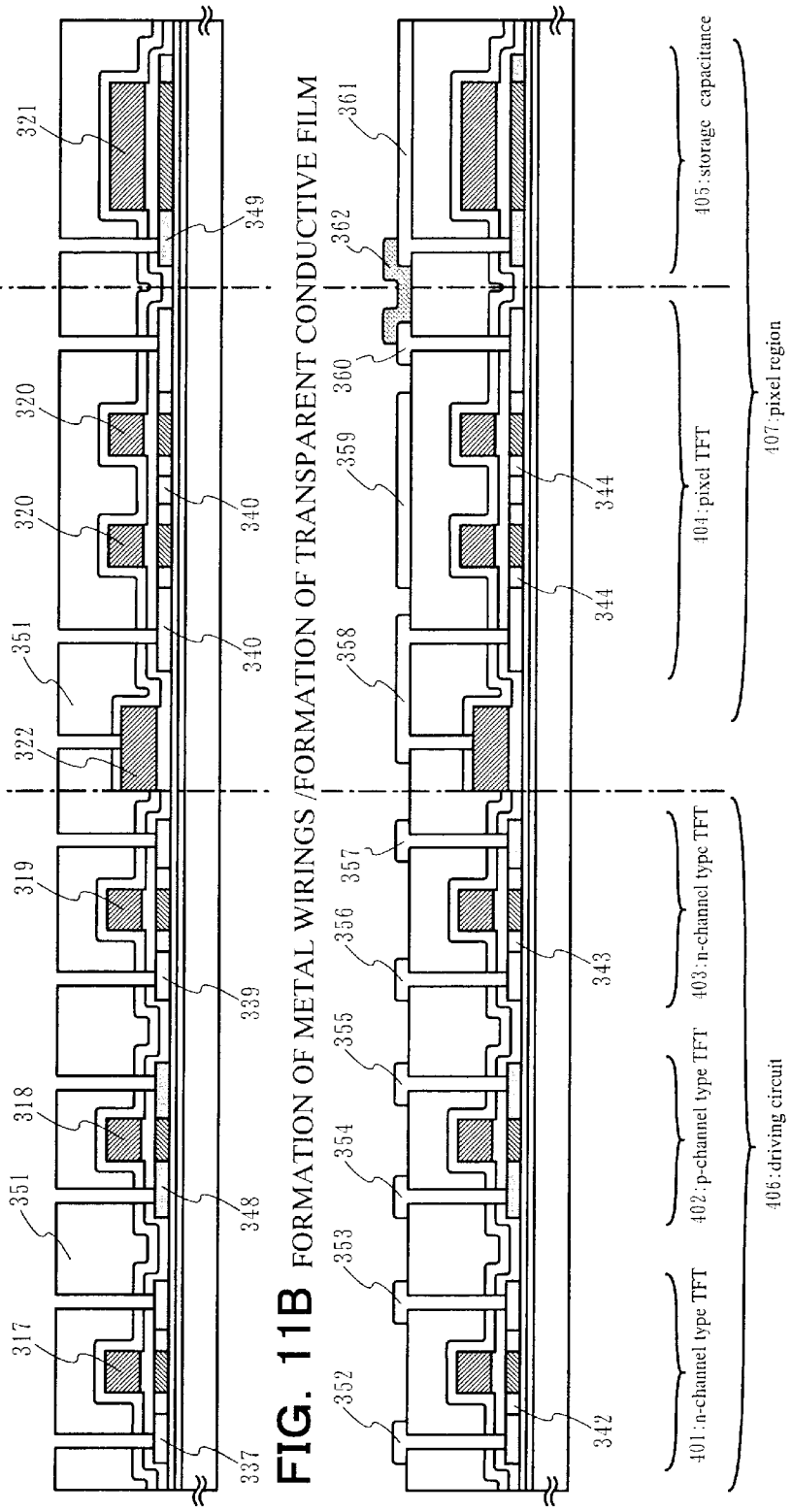

the relationship between substrate size and rotational acceleration speed.

METHOD OF MANUFACTURING A CRYSTALLINE SEMICONDUCTOR FILM

BACKGROUND OF THE INVENTION

1. Field of the Invention

The present invention relates to a method of manufacturing a crystalline semiconductor film containing silicon that is applied in an active layer of a thin film transistor (hereafter referred to as a TFT), and more particularly, to a spin addition method for a metallic element that has an effect of promoting crystallization. Further, the present invention relates to a semiconductor device having the crystalline semiconductor film.

2. Description of the Related Art

Recently, techniques of forming semiconductor integrated circuits by forming TFTs on an insulating substrate, such as a glass substrate, have been progressed rapidly, and electro-optical devices, typically active matrix liquid crystal display devices, utilizing these techniques have been put into practical use. In particular, active matrix liquid crystal display devices having integrated driver circuits are monolithic liquid crystal display devices in which a pixel matrix circuit and a driver circuit are formed on the same substrate, and the demand for these active matrix liquid crystal display devices has increased along with the demand for making them higher definition. In addition, developments are also advancing toward the realization of system on panels having built-in logic circuits such as γ compensation circuits, memory circuits, and clock generator circuits or the like.

However, it is necessary that driver circuits and logic circuits operate at high speed, and therefore the application of amorphous silicon films to the active layers, which form regions such as channel forming regions, source regions and drain regions in TFTs, is unsuitable. TFTs having a poly-crystalline silicon film as an active layer are coming into the mainstream at present. The application of low-cost glass substrates as substrates for forming TFTs is demanded, and the development of processes capable of being applied to glass substrates is flourishing.

For example, a technique is known in which a metallic element having a crystallization promotion effect, such as Ni (nickel) (hereafter referred to simply as a catalyst element) is introduced into an amorphous silicon film, and then a crystalline silicon film is formed by heat treatment. It is clear that crystallization is possible by heat treatment if a temperature on the order of 550 to 600° C., less than the heat resistant temperature of the glass substrate, is used as the heat treatment temperature. It is necessary that the catalyst element be introduced into the amorphous silicon film with this crystallization technique. Methods such as plasma CVD, sputtering, evaporation, and spin addition can be given as introduction methods.

A spin addition method, in which a solution containing a catalyst element (hereafter referred to as a catalyst element solution) is added by spinning, is disclosed in JP 07-211636 A as a method of efficiently introducing a catalyst element into the vicinity of the surface of an amorphous silicon film. The spin addition method for the catalyst element solution as disclosed in the aforementioned unexamined patent application publication has the following characteristics:

(Characteristic 1) The amount of the catalyst element added to the surface of the amorphous silicon film can easily be controlled by controlling the concentration of the catalyst element within the catalyst element solution;

(Characteristic 2) The minimum amount of the catalyst element required in crystallization can therefore be added easily to the surface of the amorphous silicon film; and (Characteristic 3) It is necessary to reduce the amount of the catalyst element within the crystallized crystalline silicon film as much as possible for reliability and electrical stability of the semiconductor device. The smallest amount of the catalyst element necessary for crystallization can be easily added by regulating the catalyst element concentration of the catalyst element solution with the spin addition method, and therefore the introduction of an excess amount of the catalyst element can be suppressed, which is advantageous for reliability and electrical stability of the semiconductor device.

The size of the glass substrates used in manufacturing of liquid crystal display devices has been becoming larger in view of the goal of applications to large size screens and increasing productivity. It has been projected that in the future, glass substrates that exceed 1 m on a side will be in use.

The above stated spin addition method for the catalyst element is one in which a liquid builds up on the substrate by dripping the catalyst element solution down onto the substrate surface, and the catalyst element solution that has been dripped down is then spun off by rotating the substrate at high velocity, thus adding a desired amount of the catalyst element to the substrate surface. This spin addition method is characterized in that the amount of the catalyst element added to the surface of the substrate can be easily controlled, and the like, and therefore it is a very important technique that is currently undergoing consideration for being put into practical use. However, there is a problem in that the uniformity of the amount of added catalyst element becomes poor as the substrate size becomes larger. In particular, the non-uniformity becomes a problem that cannot be ignored when the diagonal length of the square substrate is equal to or larger than 500 mm.

The main reason that the uniformity becomes poor is thought to be because at the spin drying state after the catalyst element solution has been applied to the substrate, the relative motion velocity with respect to air between the central portion of the substrate and regions in the periphery of the substrate differ. Caused by this, the evaporation speed of solvent components of the catalyst element solution varies within the surface of the substrate, and as a result, drying unevenness develop between the central portion and the peripheral regions.

FIG. 3 is a diagram showing the relationship between the size of the square substrate and the motion velocity at the edge portions of the substrate, and the following can be considered as causes of the generation of drying unevenness. For example, if the catalyst element solution is added to a 250 mm square substrate by spin addition, the motion velocity of the central portion of the substrate with respect to air is 0 m/min when the rotational velocity is 500 rpm (500 rotations/minute), while the edge portions of the substrate rotate at a motion velocity of approximately 400 m/min. Motion with respect to air thus becomes higher speed with increasing distance from the central portion of the substrate, and therefore friction with the air becomes severe, and the solvent components of the catalyst element solution evaporated very rapidly. Drying unevenness therefore develop due to the differences in evaporation speed of the solvent components between the central portion of the substrate and the edge portions of the substrate.

In addition, the drying unevenness caused by the different drying speeds of the solvent components tend to manifest at corner regions of the square substrate. It is thought that this is because air is pushed aside along with rotational motion in the corner regions of the substrate, and therefore the friction with the air becomes exceptionally severe there. These types of drying unevenness are large problems that influence the amount of deposited catalyst element, and that influence various fluctuations, such as fluctuations in the final crystallization ratio, the size of crystal grains, and their alignment after crystallization.

SUMMARY OF THE INVENTION

The present invention has been made in view of solving the above problems. Specifically, an object of the present invention is to resolve problems with uniformity in the amount of added catalyst element within a substrate, caused by drying unevenness in a spin addition method.

As stated above, there is a fear of a problem of non-uniformity in the amount of added catalyst element within a substrate, caused by drying unevenness during spin drying of a catalyst element solution in a spin addition method for a metallic element (catalyst element) for promoting crystallinity. In order to resolve the non-uniformity in the amount of added catalyst element within the substrate, it is necessary to eliminate the drying unevenness that occur during spin drying and which are surmised to be the cause of the non-uniformity. The drying unevenness during spin drying are thought to occur due to the development of a difference in evaporation speed for solvent components that accompanies friction with the air when the substrate is rotating.

In order to solve the above-mentioned problems and, in the spin addition process for the catalyst element, to improve the uniformity within the substrate of the amount of the catalyst element deposited thereon. The present invention takes a measure in which the rotational acceleration speed up through a switch over to high velocity rotation is optimized in accordance with the substrate size, thereby improving the uniformity of the amount of added catalyst element within the substrate.

Specifically, a method of manufacturing a crystalline semiconductor film has: a first step of depositing an amorphous semiconductor film containing silicon on an insulating substrate; a second step of adding a catalyst element for promoting crystallization to the entire surface of the amorphous semiconductor film by a spin addition method; and a third step of forming a crystalline semiconductor film containing silicon by heat treating the amorphous semiconductor film; in which the spin addition method for the catalyst element is performed with a rotational acceleration speed from 5 to 120 rpm/sec. Alternatively, the rotational acceleration speed y in the spin addition process for the catalyst element is determined by the equation $y<=Ax^{-B}$ (where x is the diagonal size of the substrate and A and B are constants).

Note that, in the case of adding the crystallization promoting catalyst element by the spin addition method, an addition method in accordance the following spin addition method may also be employed. A mask insulating film may be deposited onto an amorphous semiconductor film, and an opening region may be formed in a portion of the mask insulating film, after which the crystallization promoting catalyst element may be added to the mask insulating film by a spin addition method. The spin addition method for the catalyst element is performed at a precondition of a maximum fixed rotational velocity value of 800 to 1200 rpm. Addition of the solution containing the catalyst element is performed by dripping the solution during acceleration or during constant velocity rotation of the substrate, distributing the catalyst element over the entire surface.

Compared to a circular shape substrate, uniformity becomes poorer in the case where the diagonal length of the square substrate is equal to or greater than 500 mm with a conventional spin addition method. However, uniformity can be improved even if the diagonal of the substrate is equal to or greater than 500 mm by applying the aforementioned structure of the present invention. The amount of fluctuation in the amount of added catalyst element within the substrate is lowered in the case where the catalyst element is added by the spin addition method, and therefore the uniformity in the crystallization ratio after crystallization, the grain size, the grain arrangement, and the like can be enhanced, and a uniform crystalline semiconductor film can be formed over the entire surface of a large surface area substrate.

BRIEF DESCRIPTION OF THE DRAWINGS

In the accompanying drawings:

FIG. 3 is a diagram of the relationship between substrate size and velocity of movement at an edge portion of a substrate;

FIGS. 5A to 5F are substrate cross sectional diagrams showing a process of manufacturing a crystalline silicon film by a vertical growth method;

FIGS. 7A and 7B are cross sectional diagrams showing a process of manufacturing an active matrix liquid crystal display device;

FIGS. 8A and 8B are cross sectional diagrams showing the process of manufacturing an active matrix liquid crystal display device;

FIGS. 9A and 9B are cross sectional diagrams showing the process of manufacturing an active matrix liquid crystal display device;

FIGS. 10A and 10B are cross sectional diagrams showing the process of manufacturing an active matrix liquid crystal display device;

FIGS. 11A and 11B are cross sectional diagrams showing the process of manufacturing an active matrix liquid crystal display device;

DETAILED DESCRIPTION OF THE PREFERRED EMBODIMENTS

Embodiment Mode

Improved Experiment of Spin Addition Method

Figure 4:
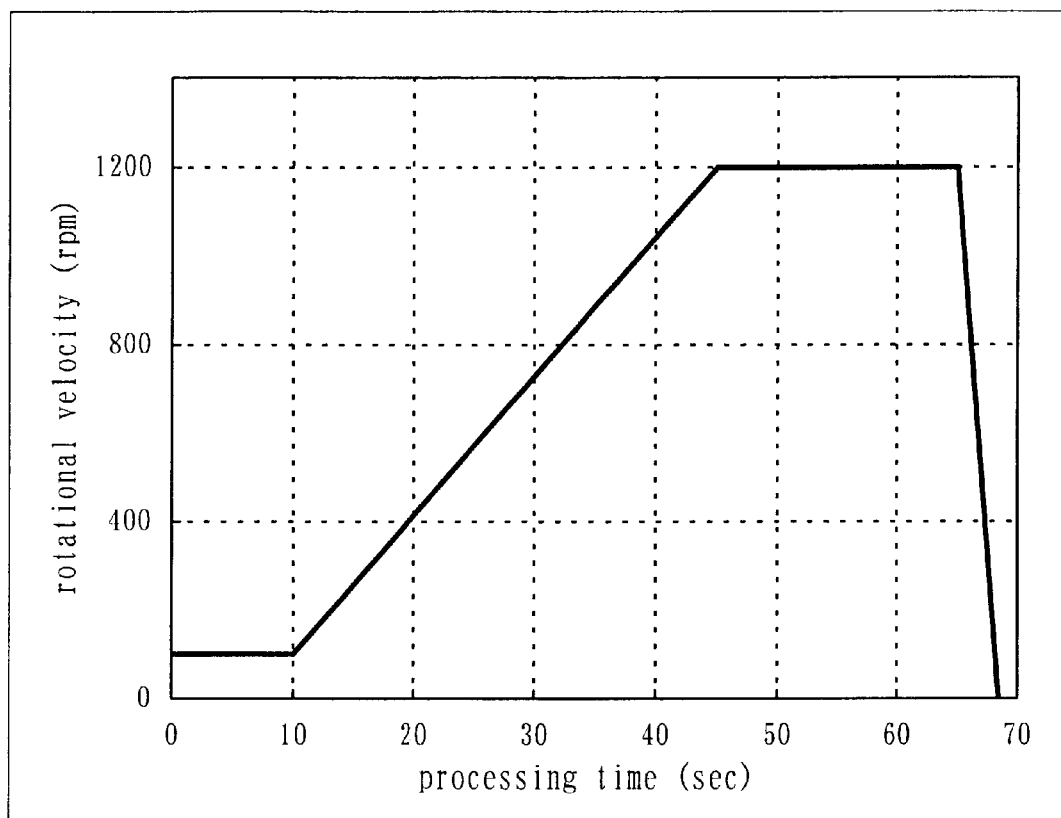
FIG. 4 is diagram showing a spin addition program of a method for spin addition of a catalyst element, and a diagram of the relationship between processing time and rotational velocity.
Figure 6A:
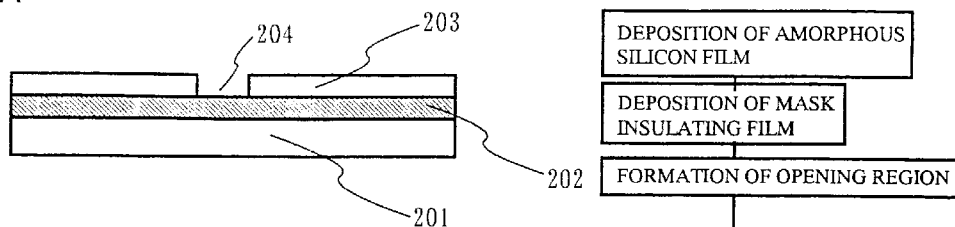
FIGS. 6A to 6E are substrate cross sectional diagrams showing a process of manufacturing a crystalline silicon film by a horizontal growth method.
Figure 6B:
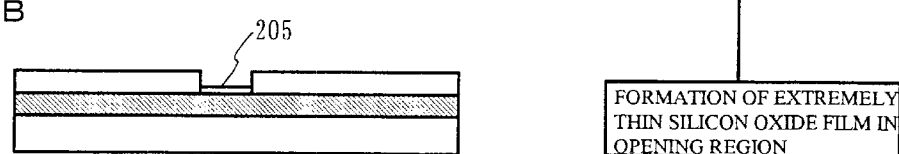
Figure 6C:
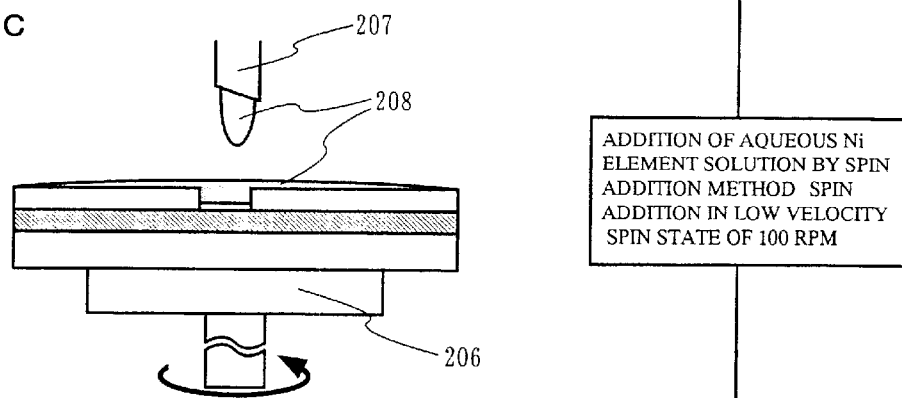
Figure 6D:
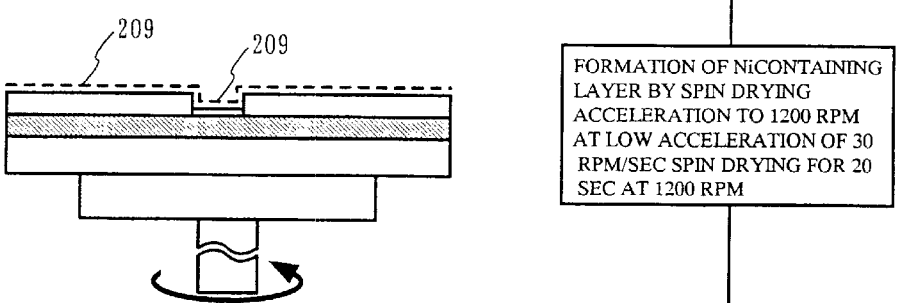
Figure 6E:
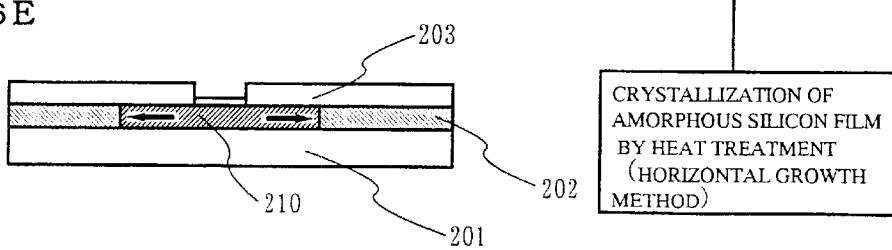

A spin addition method for a catalyst element is a method in which a catalyst element solution is dripped down onto a substrate surface, accumulated on the surface, and the dripped down catalyst element solution is then spread out by rotating the substrate at high velocity, thus a desired amount of the catalyst element being added to the substrate surface. A typical spin addition program for this spin addition method is shown in FIG. 4. The horizontal axis in FIG. 4 represents processing time (seconds), and the vertical axis represents rotational velocity of the substrate (units of rpm). The spin addition process proceeds in the following processing order: discharge of catalyst element solution during low velocity rotation, increase of rotational velocity at constant acceleration, spin drying at fixed rotational velocity, and stopping rotation. In the spin drying at fixed rotational velocity process, the load on a spin motor during rotation becomes larger along with increasing in size of the substrate, and therefore the maximum permissible range for the rotational velocity is limited. For a case of a 320 mm×400 mm substrate size, the maximum permissible range is on the order of 1200 rpm, and processing during the spin drying at fixed rotational velocity step is performed while fixed at the maximum permissible range of 1200 rpm. Therefore, a change in the processing is actually almost impossible.

Focusing on the rotational acceleration speed, a comparative evaluation of the uniformity in the amount of added catalyst element within the substrate was therefore performed while changing the rotational acceleration speed during the increase of rotational velocity at constant acceleration process. The main experimental conditions are shown in Table 1.

TABLE 1

| Item | Contents |
| --- | --- |
| Substrate | Corning 1737 substrate (thickness of 0.7 mm × 320 mm |
| Deposition of CVD | Amorphous silicon film (50 nm)/underlayer silicon oxide film (150 nm) |
| Catalyst element solution | Nickel acetate solution (10 ppm) |
| Spin rotation program | See FIG. 4 (spin acceleration speed: 15, 30, 60, 120 rpm/second) |
| Measurement on catalyst element deposit amount | Total reflection X-ray fluorescence analyzer within substrate surface: Measurements at 9 points in diagonal directions |

The substrate used in the experiment was a glass substrate, Corning Corp. 1737, having a thickness of 0.7 mm and a substrate size of 320 mm×400 mm. In this experiment, a base film (in order to prevent impurities from diffusing from the glass substrate) made from a silicon oxide film having a film thickness of 150 nm is deposited on the glass substrate by plasma CVD, an amorphous silicon film having a film thickness of 50 nm is deposited on the base film by plasma CVD, and a 10 ppm aqueous nickel acetate solution is added by spinning as a catalyst element solution. Spin addition is performed in this experiment under four rotational acceleration speed conditions: 15 rpm/sec, 30 rpm/sec, 60 rpm/sec, and 120 rpm/sec. The amount of deposited nickel elements (hereinafter expressed by Ni elements) on the amorphous silicon film on the substrate surface (strictly speaking, extremely thin silicon oxide film) was then measured by a total reflection X-ray fluorescence analyzer at 9 points in a diagonal direction within the surface of the substrate after the spin addition process was completed.

Note that if spin addition of the aqueous nickel acetate solution is performed directly onto the amorphous silicon film, then the aqueous nickel acetate solution is repelled by the surface of the amorphous silicon film because the wetting property of the amorphous silicon film surface are poor, and there is a problem in that uniform addition cannot be performed. Strictly speaking, spin addition processing of the 10 ppm aqueous nickel acetate solution is therefore performed after forming an extremely thin silicon oxide film having a film thickness of 2 to 5 nm on the surface of the amorphous silicon film in order to improve the wetting property of the amorphous silicon film surface.

Figure 1:
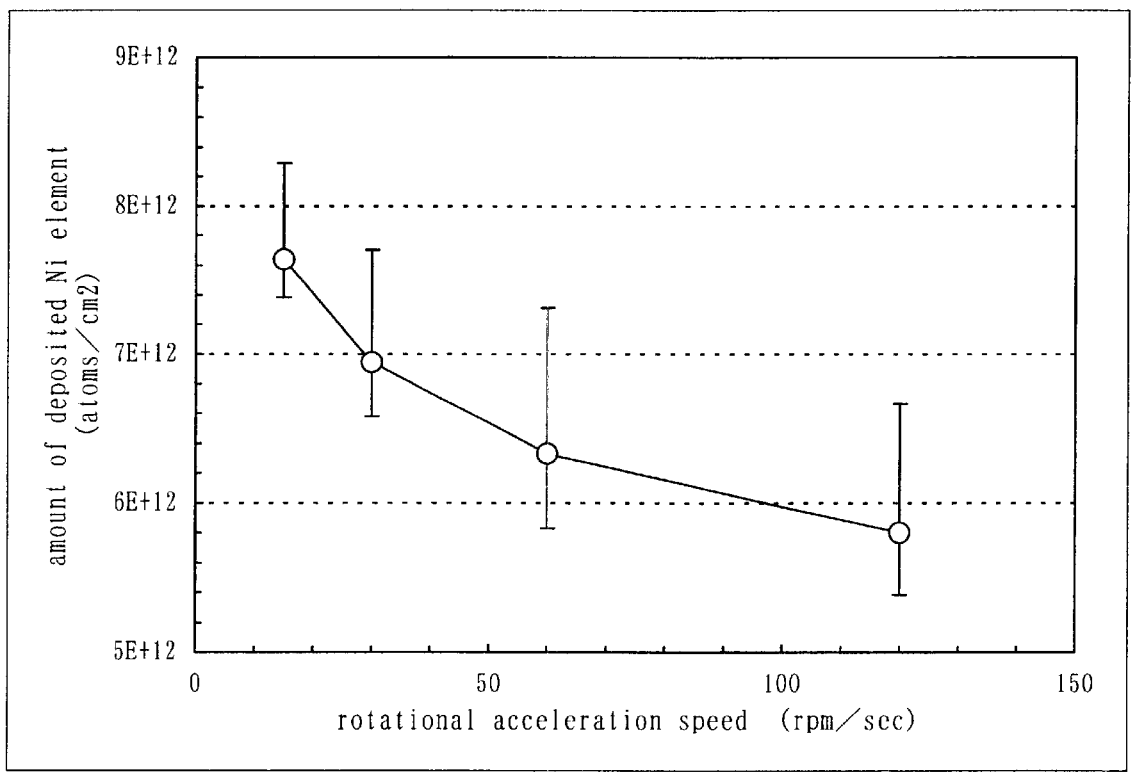
FIG. 1 is a graph showing the correlation between rotational acceleration speed and amount of deposited Ni element (average value and fluctuation range)

Experimental results are shown in FIG. 1. The horizontal axis of FIG. 1 represents rotational acceleration speed (rpm/sec), and the vertical axis represents the amount of deposited Ni elements (atoms/cm$^2$). From the results of FIG. 1, it can be seen that there is a tendency for the average value of the amount of deposited Ni elements (average of the 9 points within the substrate surface) to decrease, and for the fluctuation range, which is the difference between the maximum and minimum values within the substrate surface, to increase along with increasing rotational acceleration speed. In other words, it can be seen that there is a tendency for the average value of the amount of deposited Ni elements to increase, and for the fluctuation in the amount of deposited Ni elements within the substrate surface to decrease, along with decreasing rotational acceleration speed. For example, the average value of the amount of deposited Ni elements was $5.80 \times 10^{12}$ atoms/cm$^2$, and the fluctuation range, which is the difference between the maximum and minimum values, was $1.28 \times 10^{12}$ atoms/cm$^2$ when the rotational acceleration speed was 120 rpm/sec. For the case when the rotational acceleration speed was 15 rpm/sec, however, the average value of the amount of deposited Ni elements was $7.64 \times 10^{12}$ atoms/cm$^2$, and the fluctuation range was $0.91 \times 10^{12}$ atoms/cm$^2$. It was confirmed that the fluctuation range become smaller with decreasing the rotational acceleration speed.

Figure 15:
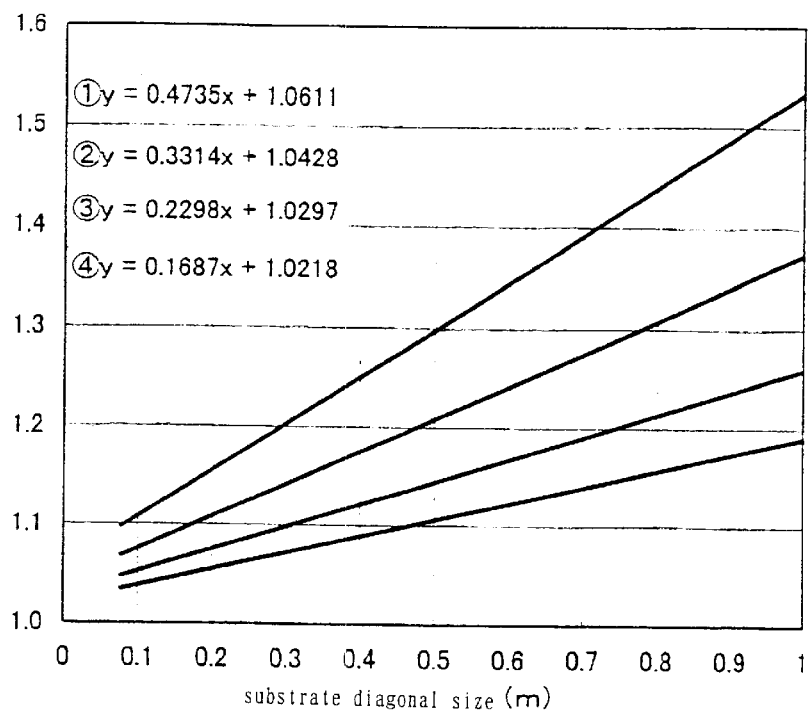
FIG. 15 is a graph showing the relationship between substrate size and Ni concentration ratio between a center portion of the substrate and an edge portion of the substrate, taking rotational acceleration speed as a parameter.

The graph shown by FIG. 15 shows the results of investigating the dependence of the Ni concentration ratio between a central portion of the substrate and edge portions of the substrate on the substrate size (diagonal length). The rotational acceleration speed was changed from 15 to 120 rpm/sec here, and the uniformity was improved as the rotational acceleration speed was decreased. From the experimental results up through this point, it can be realized that the applicable range of added Ni is from $5 \times 10^{12}$ to $1 \times 10^{13}$ atoms/cm$^2$ in the case where the amorphous silicon film is crystallized at a temperature equal to or less than 600° C. By keeping the Ni concentration within this range, uniform growth of crystal nuclei can be obtained, and crystallization can be reliably accomplished. It can be realized that if the concentration becomes higher than this concentration range, the Ni within a crystalline silicon film cannot be sufficiently removed by gettering, and the TFT characteristics will be worsened by the Ni remaining after gettering. It is thus necessary to keep the permissible concentration difference within the substrate surface equal to or less than twice the minimum concentration. It can be confirmed that the domain size of crystalline silicon films manufactured under these conditions is in a range of 15 to 20 m within the substrate surface, and that there is a uniform distribution. Note that the term domain size indicates the grain diameter observed by scanning electron microscopy after etching the surface of the crystalline silicon film with Seco liquid. Furthermore, the equations shown in FIG. 15 are correlation equations between the fluctuation of the Ni concentration within the surface and the substrate size at accelerations of 1) 120 rpm/sec, 2) 60 rpm/sec, 3) 30 rpm/sec, and 4) 15 rpm/sec.

Figure 16:
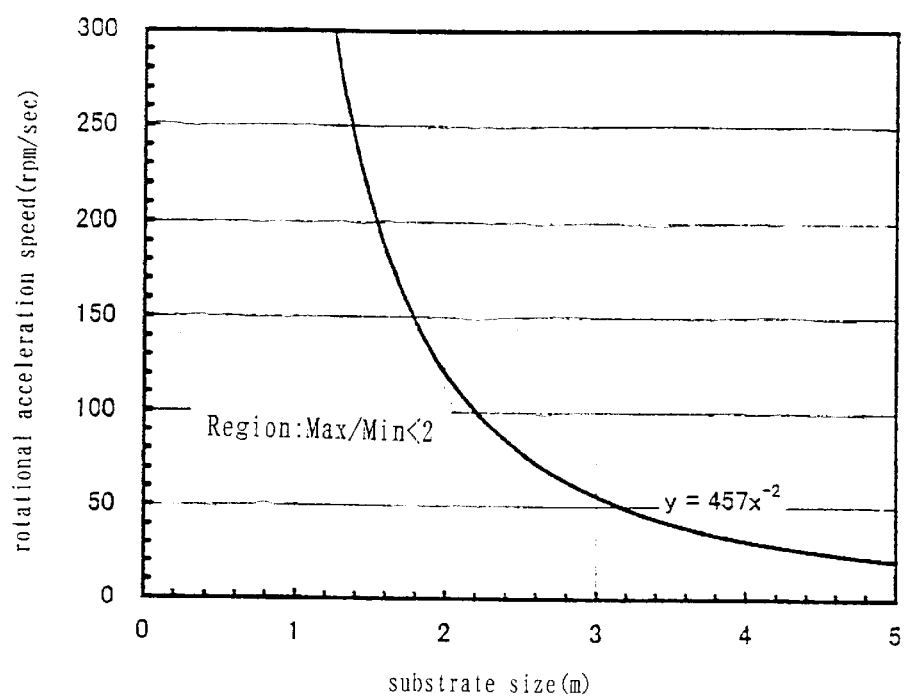
FIG. 16 is a graph showing the relationship between substrate size and rotational acceleration speed, taking the Ni concentration ratio between a center portion of the substrate and an edge portion of the substrate as a parameter.

The graph shown in FIG. 16 shows the relationship between substrate size and rotational acceleration speed. In the case where the permissible concentration difference (the Ni concentration ratio between the central portion of the substrate and the edge portions) of the substrate is 2, the rotational acceleration speed y is expressed by the function $y=Ax^{-B}$ (where x is the diagonal dimension of the substrate (m), and y is the rotational acceleration speed (rpm/sec)), as incorporated in the graph of FIG. 16. From the experimental values here, it can be given that A=457, and B=2. Rotational acceleration speeds capable of being applied may therefor be those equal to or less than y.

It is possible to reduce the fluctuation of the amount of deposited Ni element within the surface of the substrate by lowering the rotational acceleration speed in the case where the substrate size is enlarged. However, there is a disadvantage in that the time required to reach the spin drying at fixed rotational velocity (1200 rpm) step becomes longer with the reduced rotational acceleration speed, and the throughput of the overall spin addition process drops. If the relationship between the rotational acceleration speed and the amount of processing time per one substrate is calculated with the amount of time for the spin drying at fixed rotational velocity (1200 rpm) step taken as 20 seconds, then at an acceleration of 60 rpm/sec, for example, it takes 40 seconds per substrate, at 30 rpm/sec it takes 60 seconds, and at 15 rpm/sec, it takes 100 seconds. It is therefore necessary to set a suitable rotational acceleration speed by weighing the effect of reducing the fluctuation within the substrate surface of the amount of deposited Ni elements versus the drop in throughput. In the case where the substrate size is 320 mm×400 mm, it can be considered that a rotational acceleration speed equal to or less than 30 rpm/sec, preferably between 15 and 30 rpm/sec, is suitable.

Note that the rotational velocity in the spin drying at fixed rotational velocity step can also be considered to be further reduced than 1200 rpm with an increase in the size of the substrate. For example, if the substrate size is 1 m square, a rotational velocity on the order of 800 rpm is assumed, and a fixed 20 seconds for the spin drying at fixed rotational velocity (800 rpm) step is assumed for calculation, then the amount of processing time per one substrate is approximately 33 seconds when the rotational acceleration speed is 60 rpm/sec, for example, approximately 47 seconds when the rotational acceleration speed is 30 rpm/sec, and approximately 73 seconds when the rotational acceleration speed is 15 rpm/sec. It is therefore also shown that a rotational acceleration speed equal to or less than 30 rpm/sec is suitable for the case of a 1 m square substrate size, and further, that a rotational acceleration speed from 15 to 30 rpm/sec is suitable when considering the throughput of the spin addition process.

Figure 2:
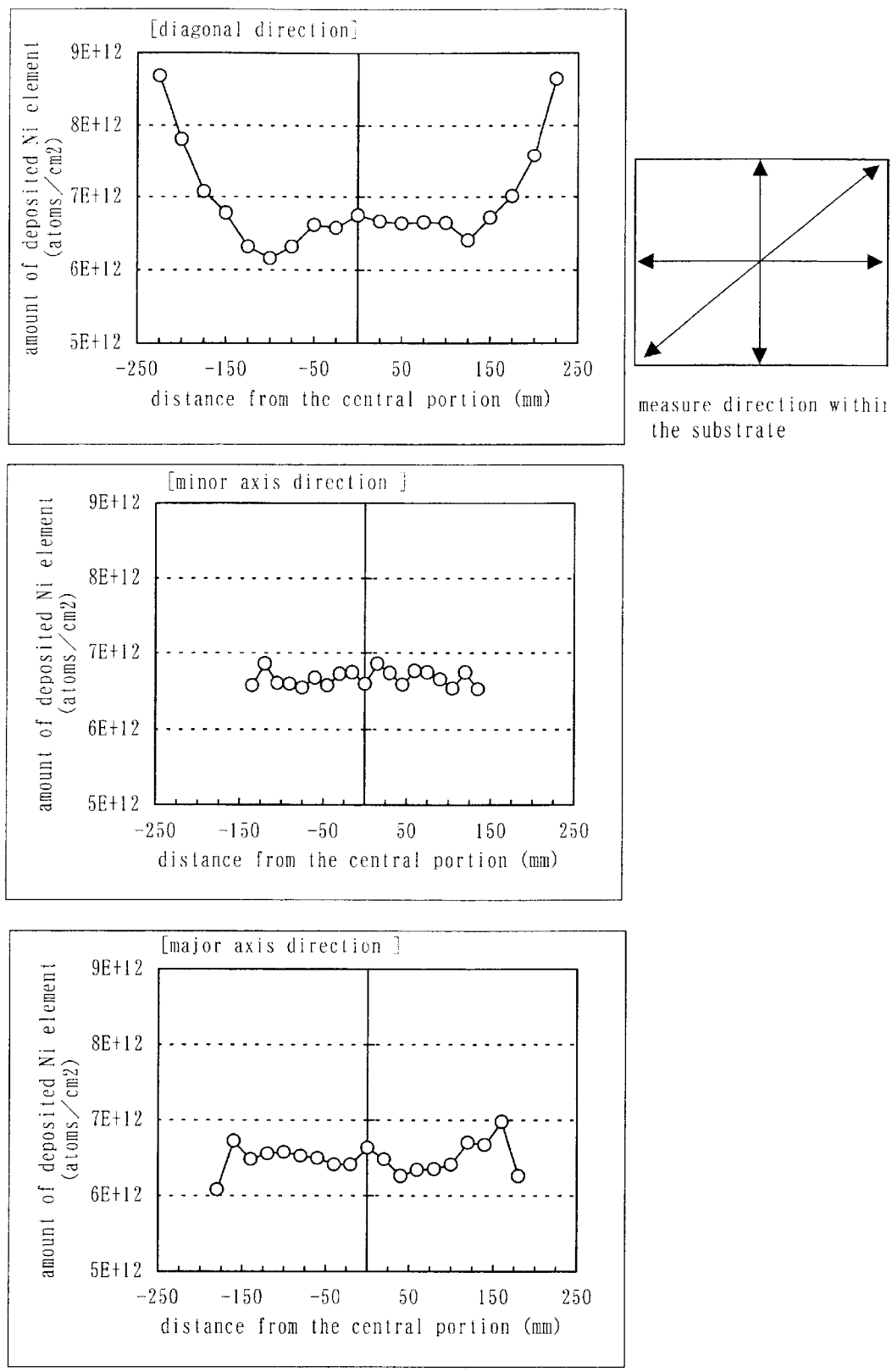
FIG. 2 is a graph of the distribution of the amount of deposited Ni element deposited within a surface of a substrate.

In addition, the distribution within the substrate surface of the amount of deposited Ni elements was also investigated experimentally, and the results are shown in FIG. 2. Note that the experimental conditions are basically the same as those of the experiment of FIG. 1, and a case of using 30 rpm/sec as the rotational acceleration speed was investigated. Further, the measurement points within the substrate surface consisted of 19 points in a diagonal direction from the substrate corner regions, 19 points in the minor axis direction of the substrate (320 mm direction), and 19 points in the major axis direction of the substrate (400 mm direction), that is, 57 measurement points in total.

From the results of FIG. 2, is can be seen that there is not a very large amount of fluctuation in the amount of deposited Ni elements in the minor axis direction and the major axis direction of the substrate. However, the amount of deposited Ni elements increased specifically in the substrate corner regions, and therefore it can be realized that the fluctuation in the amount of deposited Ni elements is particularly severe in the diagonal direction. The cause of this is thought to be that friction with the air is extraordinarily severe in the substrate corner regions during rotation of the substrate, and therefore evaporation of solvent components in the Ni element aqueous solution due to the friction becomes particularly large in the corner regions. The following can be thought when considering the cause in detail. The substrate corner regions are positioned outside of an inscribed circular region of the substrate, and therefore the substrate rotates with pushing aside air. It is considered that since the substrate corner regions push aside air while rotationally moving, friction with the air becomes extraordinarily harsh, and the evaporation of solvent components in the aqueous Ni element solution becomes especially large.

Note that the results of the first experiment, shown in FIG. 1, are experimental results found by measuring at 9 points in the diagonal direction of the substrate, and therefore these results reflect the influence of the extraordinary fluctuation in the substrate corner regions. Considering the influence of the extraordinary fluctuation in the substrate corner regions, the results of FIG. 1 therefore show that lowering the rotational acceleration speed is effective in improving on the non-uniformity of the amount of deposited Ni elements within the substrate. The results show that a rotational acceleration speed equal to or less than 30 rpm/sec is suitable, and further, that a rotational acceleration speed between 15 and 30 rpm/sec is appropriate when considering the throughput of the spin addition process.

In order to improve non-uniformity within a substrate of the amount of deposited catalyst element, from the above experiments it can be seen that the non-uniformity in the amount of added catalytic element within a substrate is improved by reducing the rotational acceleration speed up through a switch over to high velocity rotation in a catalyst element spin addition method. Note that, in the case where the substrate size is from 320 mm×400 mm to a 1 m square, it is considered that the rotational velocity of the spin drying at fixed rotational velocity step is on the order of 800 to 1200 rpm. A rotational acceleration speed equal to or less than 30 rpm/sec is therefore suitable, and further, a rotational acceleration speed from 15 to 30 rpm/sec is appropriate when considering the throughput of the spin addition process. Furthermore, if the rotational acceleration speed is lowered, then the average value of the amount of added catalyst element increases, but it is considered that this can be coped with by regulating the concentration of the catalyst element solution.

Details of Catalyst Element Solution

The catalyst element solutions used by the spin addition method of the present invention are basically the same as the catalyst element solutions disclosed in JP 07-211636 A. The content in the aforementioned unexamined patent application publication relating to the catalyst element is as follows.

It is possible to use an aqueous solution or an organic solvents for the catalyst element solution, and polar solvents such as pure water, alcohols, acids, and ammonium are preferable from the standpoint of catalyst element solubility. Further, it is also possible to apply non-polar organic solvents such as benzene, toluene, xylene, carbon tetrachloride, chlorophyl, ether, trichloroethylene, and chlorofluorocarbons as solvents for containing the catalyst element. There are cases in which the catalyst element within solution is dissolved as a chemical compound, and cases in which the catalyst element is dissolved as a simple element.

In the case where Ni element is applied as the catalyst element, Ni elements are normally introduced within solution as a Ni compound. The following can be given as typical Ni compounds: nickel bromide, nickel acetate, nickel oxalate, nickel carbide, nickel chloride, nickel iodide, nickel nitrate, nickel sulfate, nickel formate, nickel acetylacetate, 2-ethylhexane nickel, 4-cyclohexyl butanoic acid, nickel oxide, and nickel hydroxide. Further, not only may nickel compounds be used, but a method of dissolving simple Ni elements in acid may also be applied in the case where the simple Ni elements are dissolved within a solution. Note that, although the preferable state of the Ni elements within solution is normally a state in which they are completely dissolved, an emulsion state in which Ni elements are dispersed uniformly may also be employed.

It is also possible to apply metals other than Ni, such as Fe, Co, Ru, Rh, Pd, Os, Ir, Pt, Cu, and Au, as the catalyst element. A method in which one catalyst element is dissolved within a solvent is generally used as a method for applying the catalyst element, but a mixed solution in which a plurality of types of catalyst elements are dissolved may also be used. Furthermore, similar to the Ni element case, these catalyst elements may be dissolved within solution in a chemical compound state, and may also be dissolved as simple catalyst elements in an acid without any particular problems.

Typical chemical compounds of the above catalyst elements are as follows.

(Fe element): ferrous bromide, ferric bromide, ferric acetate, ferrous chloride, ferric fluoride, ferric nitrate, ferrous phosphate, ferric phosphate, and the like;
(Co element): cobalt bromide, cobalt acetate, cobalt chloride, cobalt fluoride, cobalt nitrate, and the like;
(Ru element): ruthenium chloride, and the like;
(Rh element): rhodium chloride, and the like;
(Pd element): palladium chloride, and the like;
(Os element): osmium chloride, and the like;
(Ir element): iridium trichloride, iridium tetrachloride, and the like;
(Pt element): platinic chloride, and the like;
(Cu element): cupric acetate, cupric chloride, cupric nitrate, and the like; and
(Au element): gold trichloride, gold chloride, sodium tetrachloroaurate, and the like.

Method of Manufacturing Crystalline Semiconductor Film

Means of resolving the problems with the above conventional techniques are discussed from the viewpoint of a method of manufacturing a crystalline semiconductor film containing silicon. Note that so-called vertical growth methods and horizontal growth methods exist in the method of manufacturing a crystalline semiconductor film containing silicon, and that cases of each growth method are discussed here.

(1) Vertical Growth Method

A case of applying an improved spin addition method for a catalyst element in a vertical growth method for thermal crystallization is discussed. Thermal crystallization is performed after adding a catalyst element uniformly to the entire surface of an amorphous semiconductor film containing silicon. The vertical growth method is a crystal growth method in which thermal crystallization is performed after adding a catalyst element uniformly to the entire surface of an amorphous semiconductor film containing silicon. Crystal growth proceeds in a vertical direction from the surface of the amorphous semiconductor film to which the catalyst element is added (a direction perpendicular to the substrate surface). This method is referred to as a vertical growth method in this specification.

(First step): An amorphous semiconductor film containing silicon is deposited on an insulating substrate such as a glass substrate.
(Second step): A catalyst element having an effect of promoting crystallization is added to the entire surface of the amorphous semiconductor film by a spin addition method. Non-uniformity in the amount of added catalyst element within the substrate can be improved here by lowering the rotational acceleration speed up through a switch over to the spin drying at fixed rotational velocity step in the spin addition method. Note that, in the case of using a large size substrate, up to a substrate having a size on the order of 1 m square, of which the maximum permissible range for the rotational velocity is on the order of 800 to 1200 rpm, a rotational acceleration speed equal to or less than 30 rpm/sec is suitable as the rotational acceleration speed. Furthermore, a rotational acceleration speed between 15 and 30 rpm/sec is appropriate when considering the throughput of the spin addition process.
(Third step): A crystalline semiconductor film containing silicon is formed by heat treating the amorphous semiconductor film (vertical growth method).

Further, in addition to the method of adding the catalyst element to the entire surface of the amorphous semiconductor film as above, a similar effect can also be obtained by performing the addition below the amorphous semiconductor film. For example, the catalyst element may also be added to the entire surface of the insulating substrate, or to the entire surface of a base film formed on the insulating substrate, by a spin addition method in accordance with the present invention.

(2) Horizontal Growth Method

A case of applying an improved spin addition method for a catalyst element in a horizontal growth method for thermal crystallization is discussed. Thermal crystallization is performed after selectively adding a catalyst element to a partial region of an amorphous semiconductor film containing silicon. The horizontal growth method is a crystal growth method in which thermal crystallization is performed, through an opening portion of a mask insulating film, after adding a catalyst element to a partial region of an amorphous semiconductor film containing silicon. Crystallization proceeds in a horizontal direction (a direction parallel to the substrate surface) due to thermal diffusion in peripheral regions with the opening region as a starting point. This method is referred to as a horizontal growth method in this specification.

(First step): An amorphous semiconductor film containing silicon is deposited on an insulating substrate such as a glass substrate.

(Second step): A mask insulating film is deposited on the amorphous semiconductor film, and an opening portion is formed in a partial region of the mask insulating film.

(Third step): A catalyst element having an effect of promoting crystallization is added on the mask insulating film by a spin addition method, thus introducing the catalyst element to the amorphous semiconductor film through the opening region of the mask insulating film. Non-uniformity in the amount of added catalyst element within the substrate can be improved here by lowering the rotational acceleration speed while changing to the spin drying at fixed rotational velocity step in the spin addition method. Note that, for cases of using a large size substrate, up to a substrate having a size on the order of 1 m square, of which the maximum permissible range for the rotational velocity is on the order of 800 to 1200 rpm, a rotational acceleration speed equal to or less than 30 rpm/sec is suitable as the rotational acceleration speed. Furthermore, a rotational acceleration speed between 15 and 30 rpm/sec is appropriate when considering the throughput of the spin addition process.

(Fourth step): A crystalline semiconductor film containing silicon is formed by heat treating the amorphous semiconductor film (horizontal growth method).

It is thus possible to improve the uniformity in the amount of added catalyst element within the substrate by applying the low rotational acceleration speed spin addition method to the spin addition process for the catalyst element in the method of manufacturing a crystalline semiconductor film containing silicon using both the vertical growth method and the horizontal growth method. By improving the uniformity in the amount of added catalyst element within the substrate, fluctuation within the substrate in the crystallinity of the crystalline semiconductor film containing silicon obtained after thermal crystallization can be reduced. This is considered to be effective in stabilizing the electric characteristics of TFTs structured by the crystalline semiconductor film.

Further, a term relating to amorphous semiconductor films containing silicon is used in this specification. The term amorphous semiconductor film containing silicon refers to amorphous semiconductor films which contain silicon having semiconductor characteristics in accordance with crystallization, and naturally encompasses amorphous silicon films, as well as all amorphous semiconductor films containing silicon. For example, amorphous semiconductor films composed of a silicon and germanium compound, denoted by the chemical formula $Si_{1-x}Ge_x$ (where $0<x<1$, and typically $x=0.001$ to $0.05$) are also included. Furthermore, the term crystalline semiconductor film containing silicon is used for films obtained by crystallizing an amorphous semiconductor film containing silicon. The reason that polycrystalline is not used here, and crystalline is used is that, compared to a normal polycrystalline semiconductor film, the crystalline semiconductor films here have unique properties in that their crystal grains are aligned substantially in the same direction, they have a high electric field effect mobility, and the like.

Embodiment 1

A case of applying the spin addition method of the present invention to a catalyst element addition process in a method of manufacturing a crystalline silicon film by a vertical growth method is discussed in detail in embodiment 1 based on FIGS. 5A to 5F. Note that FIGS. 5A to 5F are substrate cross sectional diagrams showing a process of manufacturing a crystalline silicon film by a longitudinal growth method.

First, an amorphous silicon film 102 is deposited at a film thickness of 10 to 150 nm on a glass substrate 201 by reduced pressure CVD or plasma CVD. In embodiment 1, a 100 nm thick film is deposited by plasma CVD for the amorphous silicon film 102. An extremely thin natural oxide film 103 (not shown) is formed on the surface of the amorphous silicon film 102 during film deposition due to the influence of oxygen within the air that is mixed into the processing atmosphere. (FIG. 5A)

Next, the substrate is cleaned for a predetermined amount of time by dilute hydrofluoric acid using a sheet-fed method cleaning process. Removal of the natural oxide film 103 formed on the surface of the amorphous silicon film 102 is performed by this process, and the substrate is then washed with water and dried (see FIG. 5B).

The surface of the amorphous silicon film 102 is then oxidized, forming a clean, extremely thin silicon oxide film 104 having a film thickness on the order of 2 to 5 nm on the surface of the amorphous silicon film 102. Although the extremely thin silicon oxide film 104 is formed by a sheet-fed aqueous ozone process in embodiment 1, the film may also be formed by processing with aqueous hydrogen peroxide, and by generating ozone using ultraviolet (UV) irradiation within an oxygen atmosphere. Note that the film formation of the extremely thin silicon oxide film 104 is a process which improves the wetting property with respect to the amorphous silicon film 102 when later adding an aqueous Ni element solution as a catalyst element solution, and in which Ni elements are thus allowed to adhere uniformly (see FIG. 5C).

The aqueous Ni element solution, which is a catalyst element solution having an effect of promoting crystallization, is then added to the entire surface of the amorphous silicon film 102 (strictly speaking, the extremely thin silicon oxide film 104) by spin addition. A spin addition process is performed at this time, in which the substrate is placed on a spin chuck 105, and an aqueous Ni element solution 107 is built up on the substrate from a supply nozzle 106 disposed above the substrate. The Ni compound nickel acetate is dissolved in pure water, the aqueous Ni element solution is regulated to have a concentration of 10 ppm Ni by weight, and spin addition is performed in a low velocity spin state of 100 rpm in embodiment 1 (see FIG. 5D).

The rotational velocity of the substrate is then increased to 1200 rpm at a rotational acceleration speed of 30 rpm/sec, a low acceleration, after which spin drying is performed for 20 sec at 1200 rpm rotational velocity, making a Ni containing layer 108 adhere uniformly over the entire surface of the amorphous silicon film 102 (strictly speaking, the extremely thin silicon oxide film 104). (See FIG. 5E.)

Note that, in this embodiment, the rotational acceleration speed is reduced to 30 rpm/sec, half of the conventional rotational acceleration speed (60 rpm/sec) when moving to high velocity rotation (1200 rpm) during spin addition of the Ni elements. Reducing the acceleration during the spin addition process is effective in improving non-uniformity within the substrate of the amount of added Ni elements, but, on the other hand, this has a disadvantage in that the amount of processing time for the Ni element addition process becomes longer. It is therefore necessary to determine the acceleration used in the spin addition process by considering the relative merits of the uniformity within the substrate in the amount of added Ni element, and productivity. If the spin addition process is performed at an acceleration of 30 rpm/sec, then the amount of processing time for spin addition per one substrate is approximately one minute, and there are also no problems related to throughput. Further, the amount of fluctuation in the amount of added Ni elements within the substrate can be suppressed to the order of 60 to 70% of that found when processing under conventional conditions (rotational acceleration speed: 60 rpm/sec).

The amorphous silicon film 102 is then heat treated in a nitrogen atmosphere using a dedicated heat treatment furnace. The heat treatment process has general characteristics in which crystallization is achieved, due to the action of the catalyst elements that promote crystallization, by heat treatment performed at a temperature range of 450 to 750° C. However, the processing time must be made longer if the processing temperature is low, thus lowering the production efficiency. Further, if processing is performed at a temperature equal to or higher than 600° C., a problem with the heat resistance of the glass substrate applied as the substrate will surface. A temperature range of 450 to 600° C. is therefore proper for the heat treatment process temperature for cases in which a glass substrate is used. Furthermore, suitable heat treatment conditions for the actual heat treatment will also differ in accordance with the method of depositing the amorphous silicon film 102. For example, it is sufficiently understood that heat treatment at 600° C. for 12 hours is appropriate if the amorphous silicon film 102 is deposited by reduced pressure CVD, while heat treatment at 550° C. for four hours is appropriate if the amorphous silicon film 102 is deposited by plasma CVD. The amorphous silicon film 102 is deposited by plasma CVD to have a film thickness of 100 nm in embodiment 1, and therefore a crystalline silicon film 109 is formed by performing heat treatment at 550° C. for four hours. Note that the uniformity in the amount of added Ni element within the substrate can be improved, and therefore a uniform crystal structure can also be obtained in the crystalline silicon film 109 after thermal crystallization (see FIG. 5F).

It is thus possible to improve the uniformity of the amount of added catalyst element within the substrate by applying the catalyst element spin addition method of the present invention to the method of manufacturing a crystalline silicon film by a vertical growth method. Further, in embodiment 1, the rotational acceleration speed in the spin addition process for the Ni element catalyst elements is set to a low acceleration of 30 rpm/sec, whereby the uniformity in the amount of added Ni element within the substrate and productivity can both be achieved.

Embodiment 2

The aqueous Ni element solution, the catalyst element solution having an effect of promoting crystallization for amorphous silicon films, is applied to the entire surface of the glass substrate 101 in FIG. 5A by a spin addition method in embodiment 1. Spin addition is performed similarly to that of embodiment 1. An amorphous silicon film is then deposited, and a crystalline silicon film can be obtained by a vertical growth method by similarly performing heat treatment.

Further, a silicon nitride film, a silicon oxynitride film or the like manufactured by plasma CVD or sputtering may also be formed to have a thickness of 10 to 200 nm as a base film on the substrate 101.

Embodiment 3

A case of applying the spin addition method of the present invention to a catalyst element addition process in a method of manufacturing a crystalline silicon film by a horizontal growth method is discussed in detail in embodiment 3 based on FIGS. 6A to 6E. Note that FIGS. 6A to 6E are substrate cross sectional diagrams showing a process of manufacturing a crystalline silicon film by a horizontal growth method.

First, an amorphous silicon film 202 is deposited at a film thickness of 10 to 150 nm on a glass substrate 201 by reduced pressure CVD or plasma CVD. In embodiment 3, a 100 nm thick film is deposited by plasma CVD for the amorphous silicon film 202. An extremely thin natural oxide film (not shown) is formed on the surface of the amorphous silicon film 202 during film deposition due to the influence of oxygen within the air that is mixed into the processing atmosphere.

Next, a mask insulating film 203 made from a silicon oxide film having a film thickness of 70 to 200 nm is deposited by plasma CVD. In embodiment 3, the mask insulating film 203 is deposited by plasma CVD to have a film thickness of 120 nm. An opening region 204 is then formed in a partial region of the mask insulating film 203 by a normal photolithography process and etching process (generally, wet etching). The opening region 204 is a portion that becomes a selective introduction region for a catalytic element (Ni elements are applied in embodiment 3), and the amorphous silicon film 202 is in an exposed state in the lower portion of the opening region 204. Note that although only one opening region is shown as a representation in FIG. 6A, in practice, a plurality of the opening regions 204 are formed at intervals of several hundred micrometers (see FIG. 6A).

An extremely thin silicon oxide film 205 having a film thickness on the order of 2 to 5 nm is then formed on the exposed region of the amorphous silicon film 202 in the opening region 204 by oxidizing the substrate. The extremely thin silicon oxide film 205 is formed in embodiment 3 by aqueous ozone processing for a predetermined amount of time, but film formation may also be performed by processing with aqueous hydrogen peroxide, and by generating ozone using ultraviolet (UV) light irradiation in an oxygen atmosphere. Note that film formation of the extremely thin silicon oxide film 205 on the surface of the amorphous semiconductor film 202 in the opening region 204 is performed in with the goal of improving the wetting property of an aqueous Ni element solution with respect to the amorphous silicon film 202 in the opening region 204 during later addition of the aqueous Ni element solution, which is a catalyst element solution, thus making Ni elements adhere uniformly (see FIG. 6B).

The aqueous Ni element catalyst element solution is then added on the substrate in order to selectively introduce Ni elements having an effect for promoting crystallization in the partial region of the amorphous silicon film 202, through the opening region 204. A spin addition process is performed at this time, in which the substrate is placed on a spin chuck 206, and an aqueous Ni element solution 208 is built up on the substrate from a supply nozzle 207 disposed above the substrate. The Ni compound nickel acetate is dissolved in pure water, the aqueous Ni element solution is regulated to have a concentration of 10 ppm Ni by weight, and spin addition is performed in a low velocity spin state of 100 rpm in embodiment 3 (see FIG. 6C).

The rotational velocity of the substrate is then increased to 1200 rpm at a rotational acceleration speed of 30 rpm/sec, a low acceleration, after which spin drying is performed for 20 sec at 1200 rpm rotational velocity, making a Ni containing layer 209 adhere uniformly over the entire surface of the substrate. Contributing to the actual crystallization of the amorphous silicon film 202 is the Ni containing layer 209 adhering to the surface of the amorphous silicon film 202 (strictly speaking, the extremely thin silicon oxide film 205) within the opening region 204 (see FIG. 6D).

Note that, in embodiment 3, the rotational acceleration speed is reduced to 30 rpm/sec, half of the conventional rotational acceleration speed (60 rpm/sec) while moving to high velocity rotation (1200 rpm) during spin addition of the Ni elements. Reducing the acceleration during the spin addition process is effective in improving non-uniformity within the substrate of the amount of added Ni elements, but, on the other hand, this has a disadvantage in that the amount of processing time for the Ni element addition process becomes longer. It is therefore necessary to determine the acceleration used in the spin addition process by considering the relative merits of the uniformity within the substrate in the amount of added Ni element, and productivity. If the spin addition process is performed at an acceleration of 30 rpm/sec, then the amount of processing time for spin addition per one substrate is approximately one minute, and there are also no problems related to throughput. Further, the amount of fluctuation in the amount of added Ni elements within the substrate can be suppressed to on the order of 60 to 70% of that found when processing under conventional conditions (rotational acceleration speed: 60 rpm/sec).

The substrate is then heat treated in a nitrogen atmosphere using a dedicated heat treatment furnace. The heat treatment has general characteristics in which crystallization of the amorphous silicon film 202 is achieved, due to the action of the catalyst elements that promote crystallization, by heat treatment performed at a temperature range of 450 to 750° C. However, the processing time must be made longer if the processing temperature is low, thus lowering the production efficiency. Further, if processing is performed at a temperature equal to or higher than 600° C., a problem with the heat resistance of the glass substrate applied as the substrate will surface. A temperature range of 450 to 600° C. is therefore proper for the heat treatment process temperature for cases in which a glass substrate is used. Heat treatment is performed for 14 hours at a temperature of 570° C. within a nitrogen atmosphere in embodiment 3, thus crystallizing the amorphous silicon film 202 and forming a crystalline silicon film 210. The Ni elements are selectively introduced through the opening region 204 at this point, and therefore the Ni elements diffuse into peripheral regions with the opening region 204 as an origin, crystallization of the amorphous silicon film 202 proceeds in a horizontal direction (a direction parallel to the substrate surface) by the process of diffusion (see FIG. 6E).

It is thus possible to improve the uniformity of the amount of added catalyst element within the substrate by applying the catalyst element spin addition method of the present invention to the method of manufacturing a crystalline silicon film by a horizontal growth method.

Embodiment 4

The present embodiment is an example in which a catalyst element spin addition method of the present invention is applied to a step of manufacturing a liquid crystal display device having the crystalline silicon film by a horizontal growth method using catalyst element and is described concretely with reference to FIGS. 7–11. Note that, the FIGS. 7–11 shows the cross sectional view of manufacturing step for active matrix type liquid crystal display device.

First, a silicon oxynitride film 302a with a thickness of 50 nm as the first layer and a silicon oxynitride film 302b with a thickness of 100 nm as the second layer that are different in composition ratio from each other are deposited on a glass substrate 301 by the plasma CVD method to form a base film 302. Examples of the glass substrate 301 used herein include quartz glass, barium borosilicate glass, aluminoborosilicate glass, and the like. Next, an amorphous silicon film 303a with a thickness of 55 nm is deposited on the base film 302 (302a and 302b) by the plasma CVD method. In depositing the amorphous silicon film 303a, an ultrathin natural oxide film (not shown) is attached to the surface of the amorphous silicon film 303a due to the effect of oxygen in the air mixed into the treating atmosphere. Note that in the present embodiment, the amorphous silicon film 303a is deposited by the plasma CVD method but may be formed by the low pressure CVD method (see FIG. 7A).

During the deposition of the amorphous silicon film 303a, there is a possibility that carbon, oxygen, and nitrogen present in the air may be mixed into the treating atmosphere. It has been known empirically that contamination by such impurity gases causes deterioration in characteristics of TFTs eventually obtained. In view of this, It has been recognized that the contamination by the impurity gases acts as a factor of crystallization inhibition. Hence, it is preferable to completely inhibit the impurity gases from being mixed into the treating atmosphere. Specifically, it is preferable to set the impurity gas concentration to be in the range of $5 \times 10^{17}$ atoms/cm$^3$ or less in both the cases of carbon and nitride and to be in the range of $1 \times 10^{18}$ atoms/cm$^3$ or less in the case of oxygen (see FIG. 7A).

Next, the substrate is washed by a treatment with dilute hydrofluoric acid for a predetermined amount of time. For this treatment, the natural oxide film (not shown) that is formed on the surface of an amorphous silicon film 303a is removed. Then the substrate is dried after aqueous washing treatment. Afterward, oxidation treatment is conducted to the amorphous silicon film 303a by aqueous ozone processing for a predetermined amount of time. For this oxidation treatment, a clean extremely thin silicon film (not shown) is formed on the amorphous silicon film 303a and the substrate is dried. The extremely thin silicon oxide film (not shown) is also formed by processing with aqueous hydrogen peroxide. Note that film formation of the extremely thin silicon oxide film is performed in with the goal of improving the wetting property of an aqueous Ni element solution with respect to the amorphous silicon film 303a during later addition of the aqueous Ni element solution, which is a catalyst element solution, thus making Ni elements adhere uniformly (see FIG. 7A).

The aqueous Ni element solution, the catalyst element solution having an effect of promoting crystallization for amorphous silicon films is applied to the entire surface of the amorphous silicon film 303a (strictly, a extremely thin silicon oxide film which is not shown) by a spin addition process. In embodiment 4, nickel acetate as a Ni compound is dissolved in pure water and then a Ni aqueous solution whose concentration has been controlled to be 10 ppm by weight conversion is applied by a spin process. The rotational velocity of the substrate is then increased to 1200 rpm at a rotational acceleration speed of 30 rpm/sec, a low acceleration, after which spin drying is performed for 20 sec at 1200 rpm rotational velocity, making a Ni containing layer (not shown) adhere uniformly over the entire surface of the amorphous silicon film 303a (strictly, a extremely thin silicon oxide film which is not shown). (FIG. 7A)

Note that, in embodiment 4, the rotational acceleration speed is reduced to 30 rpm/sec, half of the conventional rotational acceleration speed (60 rpm/sec) while moving to high velocity rotation (1200 rpm) during spin addition of the Ni elements. Reducing the acceleration during the spin addition process is effective in improving non-uniformity within the substrate of the amount of added Ni elements, but, on the other hand, this has a disadvantage in that the amount of processing time for the Ni element addition process becomes longer. It is therefore necessary to determine the acceleration used in the spin addition process by considering the relative merits of the uniformity within the substrate in the amount of added Ni element, and productivity. If the spin addition process is performed at an acceleration of 30 rpm/sec, then the amount of processing time for spin addition per one substrate is approximately one minute, and there are also no problems related to throughput. Further, the amount of fluctuation in the amount of added Ni elements within the substrate can be suppressed to on the order of 60 to 70% of that found when processing under conventional conditions (rotational acceleration speed: 60 rpm/sec).

Next, in order to control the amount of hydrogen contained in the amorphous silicon film 303a to 5 atom % or less, the substrate is heat-treated in a nitrogen atmosphere at 450° C. for one hour, thereby implementing dehydrogenation to remove the hydrogen contained in the amorphous silicon film 303a (see FIG. 7B).

Next, a heat treatment is carried out in the electrothermal furnace at 550° C. for four hours to crystallize the amorphous silicon film 303a and thus a crystalline silicon film 303b is formed. The crystalline silicon film 303b that is formed here has the uniform grain structure in the substrate because which is applied uniformly over the substrate in the step of spin addition of Ni element. Improving of uniformities of grain structure, the electrical characteristic of TFT made from the crystalline silicon film 303a is stabilized. (FIG. 7B).

Afterward, in order to improve the crystallinity of the crystalline silicon film 303b thus obtained, laser irradiation by a pulse oscillation type KrF excimer laser (with a wavelength of 248 nm) is carried out with respect to the crystalline silicon film 303b. This excimer laser has not only an effect of improving the crystallinity of the crystalline silicon film 303b but also an effect of improving the efficiency of gettering by a gettering source since the Ni element is brought into a state where the Ni element can move very easily in the crystalline silicon film 303b (see FIG. 7B).

Next, pattern formation of the crystalline silicon film 303b is conducted by the ordinary photolithography and dry etching to form semiconductor films 304 to 308 to be channel, source, and drain regions of TFTs. Note that, after the formation of semiconductor layer 304–308, for the Vth controle of TFT, channel doping that is n-type or p-type impurities (B: boron or P: Phosphorous) ion doping can be conducted. (see FIG. 8A).

Next, a gate insulating film 309 made of a silicon oxynitride film with a thickness of 100 nm is deposited by the plasma CVD method to cover the semiconductor films 304 to 308. In depositing the gate insulating film 309, the natural oxide film (not shown) attached to the surface of the semiconductor film 304–308 is washed with dilute hydrofluoric acid. Afterward, a conductive film as a gate electrode material is deposited on the gate insulating film 309 by the sputtering method or the CVD method. As the gate electrode material used here, a heat resistant material is preferable that can withstand the heat treatment temperature (about 550 to 650° C.) for gettering as a later step that also serves for activating the impurity elements. Examples of the heat resistant material include high melting metals such as Ta(tantalum), Mo(molybdenum), Ti(titanium), W(tungsten), Cr(chromium), and the like, metal silicide as a compound of a high melting metal and silicon, polycrystalline silicon having n-type or p-type conductivity, and the like. Note that in the present embodiment, a gate electrode film 310 formed from a W film with a thickness of 400 nm is deposited by the sputtering method (see FIG. 8B).

Above the substrate with the configuration described above are formed gate electrodes 317 to 320, an electrode 321 for storage capacitance, and an electrode 322 to function as a source wiring through the implementation of photolithography and dry etching for the formation of gate electrodes. After the dry etching, resist patterns 311 to 314 as a mask for the dry etching remain on the gate electrodes 317 to 320. Similarly, resist pattern 315 remain on the electrode 321 for storage capacitance and the electrode 322 to function as a source wiring, respectively. Note that the dry etching proceeds, the gate insulating film 309 made of the silicon oxynitride film as a base is reduced in thickness to be deformed into a shape of a gate insulating film 323 (see FIG. 9A).

Next, with the resist patterns 311 to 316 remaining, doping with a low concentration n-type impurity is carried out as a first ion doping process using the ion doping apparatus with the gate electrodes 317 to 320 and the electrode 321 for storage capacitance used as a mask. The ion doping process is carried out using a p element as an n-type impurity under the conditions including an accelerating voltage of 6 to 100 kV and a dose of $3 \times 10^{12}$ to $3 \times 10^{13}$ ions/cm$^2$. By this first ion doping process, low concentration impurity regions (n$^-$ regions) 329 to 333 containing the n-type impurity are formed in the regions of the semiconductor films 304 to 308 corresponding to the regions located outside the respective gate electrodes 317 to 320 and the electrode 321 for storage capacitance. At the same time, substantially intrinsic regions 324 to 327 to function as channels of the TFTs are formed directly under the gate electrodes 317 to 320. In the semiconductor film 308 located directly under the electrode 321 for storage capacitance, an intrinsic region 328 to function as one of electrodes for capacitance formation is formed since the region is not the TFT formation region but is a region where the storage capacitance 405 is to be formed (FIG. 9A).

Next, the substrate is washed with a special-purpose peeling liquid and thus the resist patterns 311 to 316 that have served as a mask for dry etching are removed. After the removal, in order to allow the n-channel type TFTs 401 and 403 in a driving circuit 406 and the pixel TFT 404 in a pixel region 407 to have a lightly doped drain (LDD) structure, resist patterns 334 to 336 for the formation of n$^+$ regions to serve as a mask for a second ion doping process are formed to cover the gate electrodes 317, 319, and 320 that are present in the above-mentioned regions. (see FIG. 9B).

Afterward, doping with a high-concentration n-type impurity is carried out as the second ion doping process. The ion doping process is carried out under the doping conditions including an accelerating voltage of 60 to 100 kV and a dose of $1.7 \times 10^{15}$ ions/cm$^2$. By this ion doping process, high-concentration impurity regions (REGIONS) 337, 339, and 340 containing the n-type impurity are formed in the regions of the semiconductor films 304, 306, and 307 corresponding to the regions located outside the resist patterns 334 to 336. With the formation of the high-concentration impurity regions (n$^+$ regions) 337, 339, and 340, the low-concentration impurity regions (n$^-$ regions) 329, 331, and 332 that have already been formed are separated into the high-concentration impurity regions (n$^+$ regions) 337, 339, and 340 and the low-concentration impurity regions (n$^-$ regions) 342 to 344 and thus the source and drain regions to compose the LDD structure are formed. At this time, the region of the p-channel type TFT 402 of the driving circuit 406 and the region of the storage capacitance 405 in the pixel region 407 that are regions other than the regions where the LDD structures are formed are ion-doped with the gate electrode 318 and the electrode 321 for storage capacitance used as a mask, respectively. Hence, high-concentration impurity regions (n⁺ regions) 338 containing the n-type impurity are formed in the regions of the semiconductor film 305 corresponding to the regions located outside the gate electrode 318, and high-concentration impurity regions (n⁺ regions) 341 containing the n-type impurity are also formed in the regions of the semiconductor film 308 corresponding to the regions located outside the electrode 321 for storage capacitance (see FIG. 9B)

Next, by the ordinary photolithography, resist patterns 345 to 347 are formed with using as its opening regions the region of the semiconductor film 305 corresponding to the p-channel type TFT 402 and the region of the semiconductor film 308 corresponding to the storage capacitance 405. Afterward, with the resist patterns 345 to 347 used as a mask, doping with a high-concentration p-type impurity is carried out as a third ion doping process using the ion doping apparatus. By this ion doping process, a boron element as a p-type impurity is ion-implanted into the region of the semiconductor film 305 corresponding to the p-channel type TFT 402 with the gate electrode 318 used as a mask. As a result, high-concentration impurity regions (p⁺ regions) 348 having p-type conductivity are formed in the regions of the semiconductor film 305 corresponding to the regions outside the gate electrode 318. The high-concentration impurity regions (p⁺ regions) 348 have already been doped with the phosphorous element as an n-type impurity but are doped to contain a high concentration of boron element so that the dose of the boron element reaches $2.5 \times 10^{15}$ atoms/cm². Thus, high-concentration impurity regions (p⁺ regions) 348 having p-type conductivity to function as source and drain regions are formed. Similarly in the region where the storage capacitance 405 is formed, high-concentration impurity regions (p⁺ regions) 349 having p-type conductivity are also formed in the regions of the semiconductor film 308 corresponding to the regions outside the electrode 321 for storage capacitance (see FIG. 10A).

Next, after the removal of the resist patterns 345 to 347, a first interlayer insulating film 350 made of a silicon oxynitride film with a thickness of 150 nm is deposited by the plasma CVD method. Afterward, for the thermal activation of the impurity ions (the phosphorous and boron element) with which the semiconductor films 304 to 308 have been doped, a heat treatment is carried out in an electrothermal furnace at 600 C. for 12 hours. This heat treatment is carried out for the thermal activation of the impurity ions but also is intended to getter the Ni element present in the substantially intrinsic regions 324 to 327 to function as channel regions and the intrinsic region 328 to function as one of the electrodes for capacitance formation by the impurity ions. Note that the thermal activation may be carried out before the deposition of the first interlayer insulating film 350. However, when the wiring materials for the gate electrodes or the like have low heat resistance, it is preferable to carry out the thermal activation after the deposition of the first interlayer insulating film 350. Afterward, in order to terminate unsaturated bonds present in the semiconductor films 304 to 308, a hydrogen treatment is carried out in a 3% hydrogen-containing nitrogen atmosphere at 410 C. for one hour (see FIG. 10B).

Next, a second interlayer insulating film 351 made from an acrylic resin film with a thickness of 1.6 ì m is formed on the first interlayer insulating film 350. Afterward, contact holes are formed by the ordinary photolithography and dry etching so as to pass through the second interlayer insulating film 351, the first interlayer insulating film 350, and the gate insulating film 323 as an underlayer film. At this time, the contact holes are formed to be connected to the electrode 322 to function as a source wiring and the high-concentration impurity regions 337, 339, 340, 348, and 349 (see FIG. 11A).

Next, conductive metal wirings 352 to 357 are formed to be electrically connected to the high-concentration impurity regions 337, 339, and 348 of the driving circuit 406. Connection electrodes 358, 360, and 361 and gate wiring 359 in the pixel region 407 are formed with the same conductive material. In the present embodiment, a laminated film composed of a Ti film with a thickness of 50 nm and an Al—Ti alloy film with a thickness of 500 nm is applied as a constituent material for the metal wirings 352 to 357, the connection electrodes 358, 360, and 361, and the gate wiring 359. The connection electrode 358 is formed so as to electrically connect the impurity region 340 with the electrode 322 to function as a source wiring. The connection electrode 360 is formed to be electrically connected to the impurity region 340 of the pixel TFT 404. The connection electrode 361 is formed to be electrically connected to the impurity region 349 of the storage capacitance 405. In addition, the gate wiring 359 is formed to electrically connect a plurality of gate electrodes 320 of the pixel TFT 404 to each other. Afterward, a transparent conductive film such as an indium tin oxide (ITO) film with a thickness of 80 to 120 nm is deposited and then a pixel electrode 362 is formed by photolithography and etching. The pixel electrode 362 is electrically connected to the impurity regions 340 as the source and drain regions of the pixel TFT 404 through the connection electrode 360 and is also electrically connected to the impurity region 359 of the storage capacitance 405 through the connection electrode 361 (FIG. 11B).

As shown in above, in the manufacturing steps of active matrix type liquid crystal device contained an n-channel type TFT having LDD structure and a p-channel type TFT having single drain structure, spin additional method with law rotational acceleration (rotational acceleration speed 30 rpm/sec.) is applied to the spin additional steps of catalyst element solution (aqueous element solution). Therefore, the amount of fluctuation in the amount of added Ni elements within the substrate can be suppressed to on the order of 60 to 70% of that found when processing under conventional conditions (rotational acceleration speed: 60 rpm/sec.) and homogeneous of the amount of added Ni element is improved. By increasing the homogeneity of the crystalline structure in the substrate, which have influence to the reduction of the amount of fluctuation in the amount of crystallinity in the crystalline silicon film obtained after heat crystallization and also have good influence to the stabilizing the electrical characteristic of TFT made from the crystalline silicon film. Therefore, in the manufacturing method of liquid crystal display device having crystalline silicon film using catalyst, the catalyst element spin additional method of this invention is the important technique for the stabilizing the electrical characteristic of TFT.

Embodiment 5

The present invention relates to the method of manufacturing a crystalline semiconductor film containing silicon and which is applicable to manufacturing various semiconductor devices. Therefore, the present invention can be applied to various semiconductor devices comprising liquid display device as a display device. Examples of the semiconductor device are shown in FIGS. 12 to 14. Following can be given as such semiconductor device: video cameras; digital cameras; projectors (rear type or front type); head mounted displays (goggle type displays); game equipments; car navigation systems; personal computers; portable information terminals (mobile computers, portable telephones or electronic books etc.) etc.

Figures 12A, 12B:
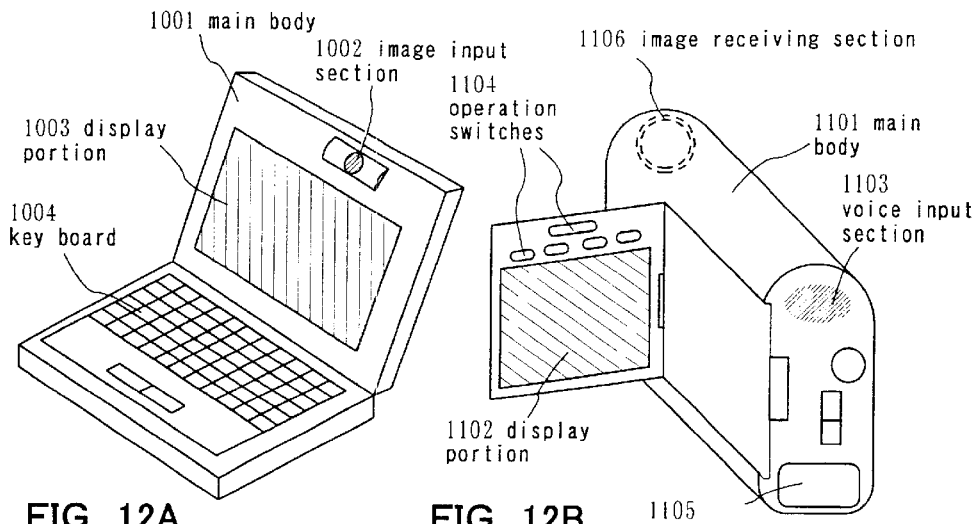
FIGS. 12A to 12F are device schematic diagrams showing examples of semiconductor devices having integrated liquid crystal display devices.

FIG. 12A is a personal computer which comprises: a main body 1001; an image input section 1002; a display portion 1003; and a key board 1004. The present invention can be applied to the display portion 1003 and the other circuit.

FIG. 12B is a video camera which comprises: a main body 1101; a display portion 1102, a voice input section 1103; operation switches 1104; a battery 1105 and an image receiving section 1106. The present invention can be applied to the display portion 1102 and the other circuit.

Figures 12C, 12D:
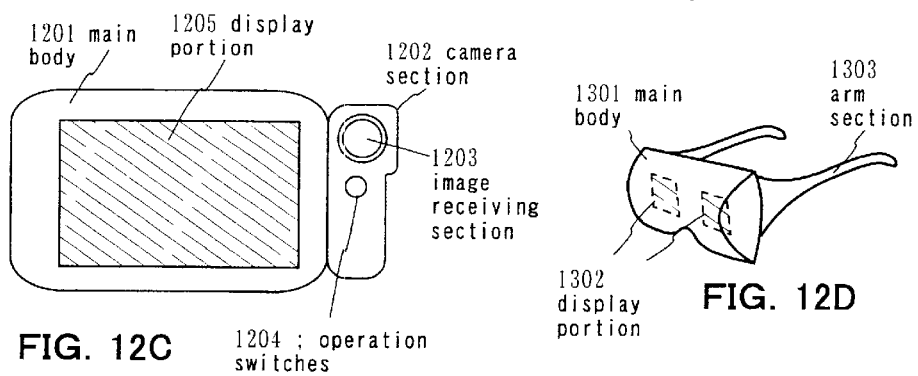

FIG. 12C is a mobile computer which comprises: a main body 1201; a camera section 1202; an image receiving section 1203; operation switches 1204 and a display portion 1205. The present invention can be applied to the display portion 1205 and the other circuit.

FIG. 12D is a goggle type display which comprises: a main body 1301; a display portion 1302; and an arm section 1303. The present invention can be applied to the display portion 1302 and the other circuit.

Figures 12E, 12F:
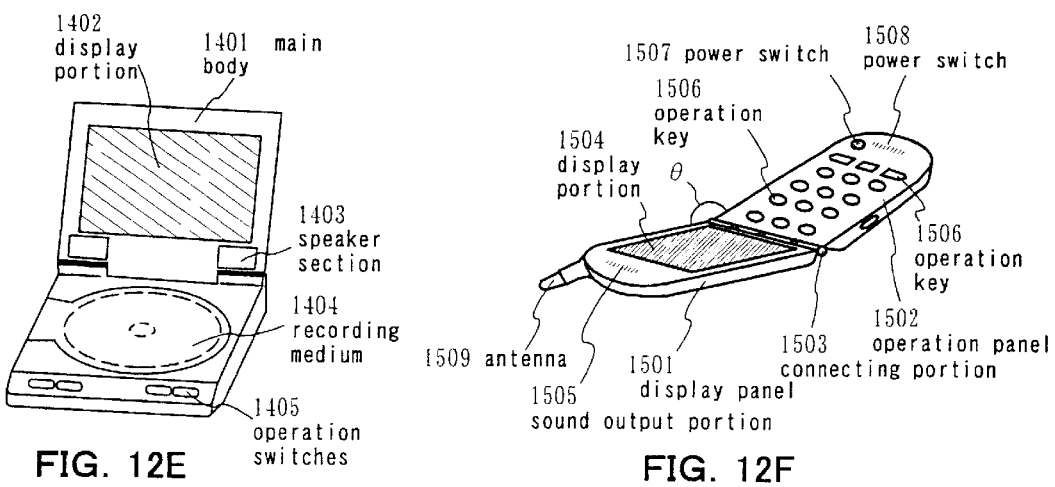

FIG. 12E is a player using a recording medium which records a program (hereinafter referred to as a recording medium) which comprises: a main body 1401; a display portion 1402; a speaker section 1403; a recording medium 1404; operation switches 1405. This device uses DVD (digital versatile disc), CD, etc. for the recording medium, and can be used for music appreciation, games and Internet. The present invention can be applied to the display portion 1402 and the other circuit.

FIG. 12F is a mobile phone which comprises: a display panel 1501; an operation panel 1502; a connecting portion 1503; a display portion 1504; a sound output portion 1505; an operation key 1506; a power switch 1507; a sound input portion 1508; and an antenna 1509. The display panel 1501 and the operation panel 1502 are connected each other at the connecting portion 1503. The angle θ between the surface of the display panel 1501 providing display portion 1504 and the surface of the operation panel 1502 providing operation key 1506 can be changed arbitrarily in the connecting portion 1503. The present invention can be applied to the display portion 1504.

Figure 13A:
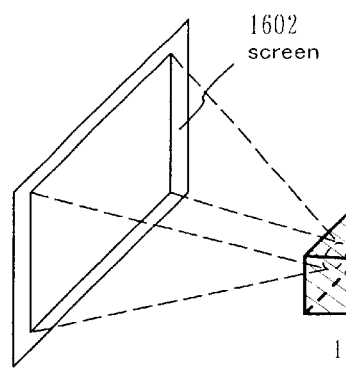
FIGS. 13A to 13D are device schematic diagrams showing examples of semiconductor devices having integrated liquid crystal display devices.

FIG. 13A is a front type projector which comprises: an optical light source system and a display portion 1601; and a screen 1602. The present invention can be applied to the display portion 1601 and the other circuit.

Figure 13B:
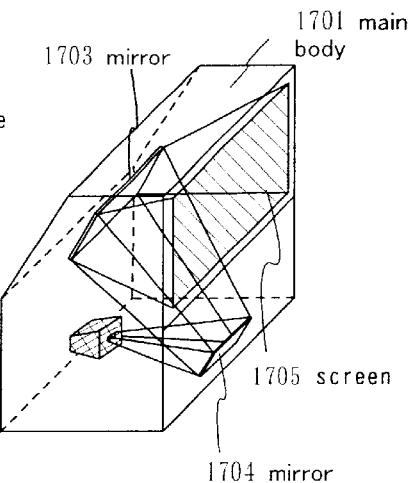

FIG. 13B is a rear type projector which comprises: a main body 1701; an optical light source system and a display portion 1702; a mirror 1703; a mirror 1704; and a screen 1705. The present invention can be applied to the display portion 1702 and the other circuit.

Figure 13C:
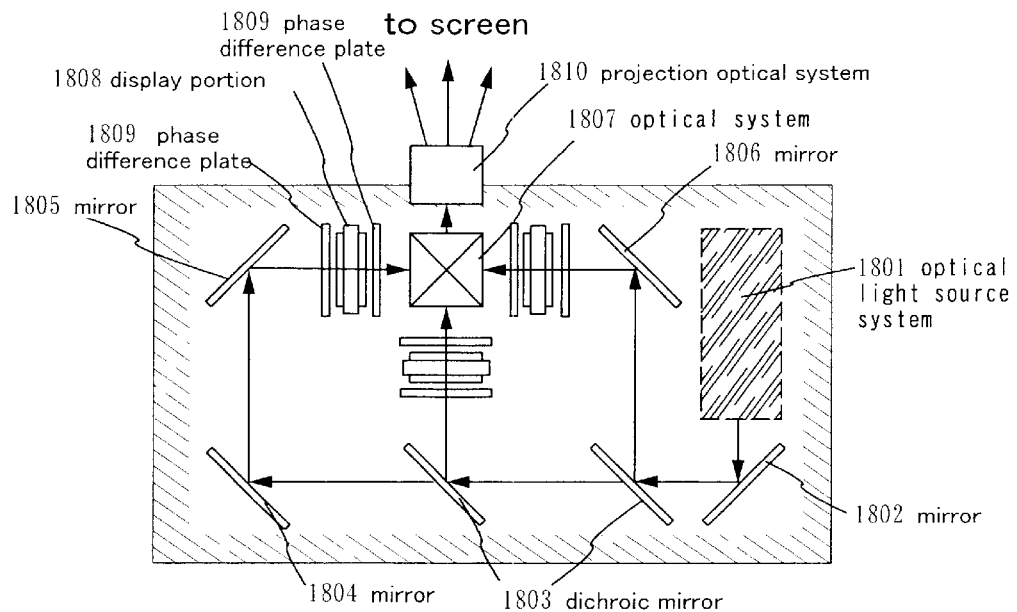

FIG. 13C is a diagram which shows an example of the structures of the optical light source system and display portions 1601 and 1702 of FIGS. 13A and 13B. Each of the optical light source system and display portions 1601 and 1702 comprises: an optical light source system 1801; mirrors 1802 and 1804 to 1806; a dichroic mirror 1803; an optical system 1807; a display portion 1808; a phase differentiating plate 1809; and a projection optical system 1810. The projection optical system 1810 comprises a plurality of optical lenses having a projection lens. This structure is called as a three-plate type in which 3 display portions 1808 are used. Further, an operator may appropriately dispose an optical lens, a film which has a function to polarize light, a film which adjusts a phase difference and an IR film, etc in the optical path shown by an arrow in FIG. 13C.

Figure 13D:
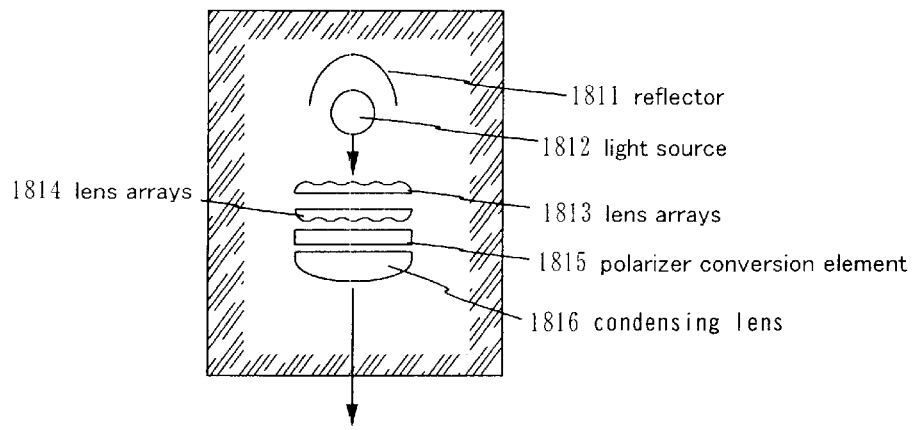

FIG. 13D is a diagram showing an example of a structure of the optical light source system 1801 in FIG. 13C. In the present embodiment, the optical light source system 1801 comprises: a reflector 1811; a light source 1812; lens arrays 1813 and 1814; a polarizer conversion element 1815; and a condensing lens 1816. Note that the optical light source system shown in FIG. 13D is merely an example and the structure is not limited to this example. For instance, an operator may appropriately dispose an optical lens, a film which has a function to polarize light, a film which adjusts a phase difference and an IR film, etc.

Figure 14A:
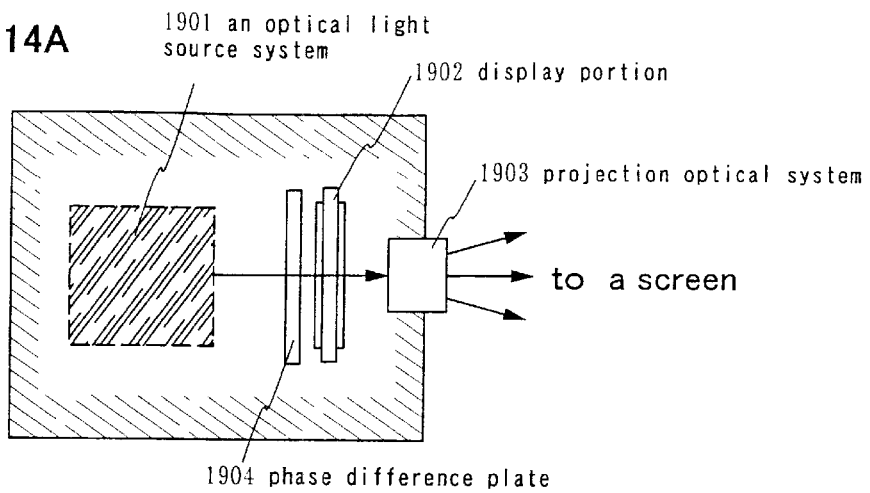
FIGS. 14A to 14C are device schematic diagrams showing examples of semiconductor devices having integrated liquid crystal display devices.

FIG. 14A is a diagram showing an example of a single plate type. The optical light source system and a display portion shown in FIG. 14A comprises: an optical light source system 1901, a display portion 1902, a projection optical system 1903 and a phase difference plate 1904. The projection optical system 1903 comprises a plurality of optical lenses including a projection lens. The light source system and a display portion shown in FIG. 14A can be applied to the optical light source systems and display portions 1601 and 1702 shown in FIGS. 13A and 13B. An optical light source system shown in FIG. 13D may be used as the optical light source system 1901. Note that a color filter is disposed in the display portion 1902 (not shown) and the displayed image is colored.

Figure 14B:
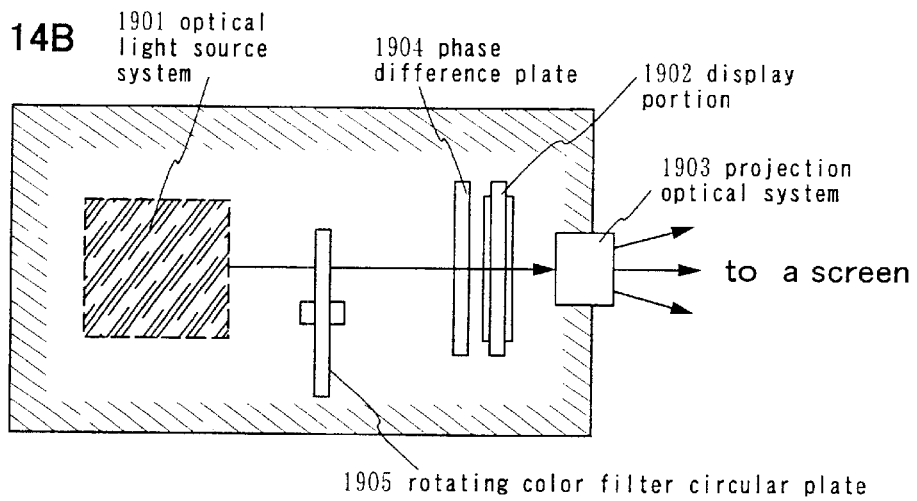

An optical light source system and a display portion shown in FIG. 14B is an application of FIG. 14A and the displayed image is colored by using a rotating color filter circular plate 1905 of RGB in place of disposing a color filter. The light source system and a display portion shown in FIG. 14B can be applied to the optical light source systems and display portions 1601 and 1702 shown in FIGS. 13A and 13B.

Figure 14C:
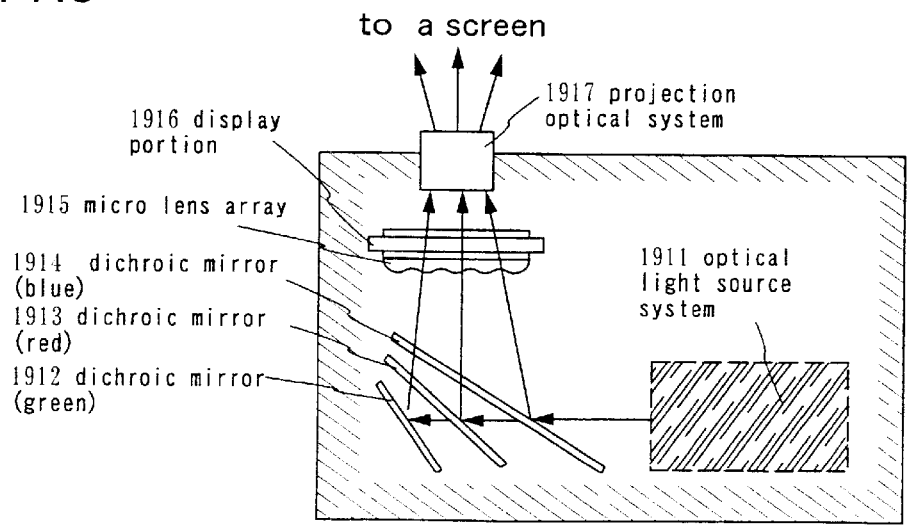

An optical light source system and a display portion shown in FIG. 14C is called as a color-filter-less single plate system. This system disposes a micro lens array 1915 in the display portion 1916, and the displayed image is colored by using a dichroic mirror (green) 1912, a dichroic mirror (red) 1913 and a dichroic mirror (blue) 1914. The projection optical system 1917 comprises a plurality of optical lenses including a projection lens. The light source system and a display portion shown in FIG. 14C can be applied to the optical light source systems and display portions 1601 and 1702 shown in FIGS. 13A and 13B. Further as an optical light source system 1911, an optical system using a coupling lens and a collimator lens in addition to the light source may be used.

As described above, the applicable range of the present invention is very large, and it is possible to apply to semiconductor device comprising active matrix type liquid display device of various fields.

The present invention relates to a method of manufacturing a crystalline semiconductor film containing silicon. In particular, the present invention relates to a method of spin addition for a catalyst element, the method characterized by low rotational acceleration speed, and the main effects are listed below.

(Effect 1) It is possible to improve the uniformity of the amount of added catalyst element within a substrate by reducing the rotational acceleration speed until moving to high velocity rotation for spin drying in the spin addition process for the catalyst element.

(Effect 2) It is possible to improve the uniformity of the amount of added catalyst element within the substrate by reducing the rotational acceleration speed to a value equal to or less than 30 rpm/sec until moving to high velocity rotation for spin drying in the spin addition process for the catalyst element. Further, it is possible to increase the uniformity of the amount of added catalyst element within the substrate, and to maintain throughput of the spin addition process, by setting the rotational acceleration speed to between 15 and 30 rpm/sec.

(Effect 3) A reduction in fluctuation in crystallinity within the substrate in a crystalline silicon film containing silicon obtained after thermal crystallization can be obtained by improving the uniformity of the amount of added catalyst element within the substrate, and this is therefore effective in stabilizing the electrical characteristics of TFTs structured by the crystalline semiconductor film.

What is claimed is:

1. A method of manufacturing a crystalline semiconductor film containing silicon, said method comprising:
    a first step of depositing an amorphous semiconductor film containing silicon over an insulating substrate;
    a second step of adding a metallic element for promoting crystallization to a entire surface of the amorphous semiconductor film by a spin addition method; and
    a third step of forming the crystalline semiconductor film by heat treating the amorphous semiconductor film;
    wherein a rotational acceleration speed in the spin addition method is from 5 to 120 rpm/sec.

2. A method of manufacturing a crystalline semiconductor film according to claim 1, wherein the insulating substrate has a square shape.

3. A method of manufacturing a crystalline semiconductor film according to claim 1, wherein the length of a diagonal of the insulating substrate is equal to or larger than 500 mm.

4. A method of manufacturing a crystalline semiconductor film according to claim 1, wherein the maximum value of a rotational velocity in the spin addition method is from 800 to 1200 rpm.

5. A method of manufacturing a crystalline semiconductor film according to claim 1, wherein the second step is one in which a solution containing the metallic element is dripped onto the entire surface of the amorphous semiconductor film over the insulating substrate while the substrate is rotating.

6. A method of manufacturing a crystalline semiconductor film according to claim 1, wherein the metallic element is added by spinning using a solution containing one element or a plurality of elements, said element or said plurality of elements selected from the group consisting of Fe, Co, Ni, Ru, Rh, Pd, Os, Ir, Pt, Cu, and Au.

7. A method of manufacturing a crystalline semiconductor film containing silicon, said comprising:
    a first step of depositing an amorphous semiconductor film containing silicon over an insulating substrate;
    a second step of adding a metallic element for promoting crystallization to an entire surface of the amorphous semiconductor film by a spin addition method; and
    a third step of forming the crystalline semiconductor film by heat treating the amorphous semiconductor film;
    wherein a rotational acceleration speed y in the spin addition method satisfies $y=Ax^{-B}$ (where x is the diagonal dimension of the substrate, and A and B are constant).

8. A method of manufacturing a crystalline semiconductor film according to claim 7, wherein the insulating substrate has a square shape.

9. A method of manufacturing a crystalline semiconductor film according to claim 7, wherein the length of a diagonal of the insulating substrate is equal to or larger than 500 mm.

10. A method of manufacturing a crystalline semiconductor film according to claim 7, wherein the maximum value of a rotational velocity in the spin addition method is from 800 to 1200 rpm.

11. A method of manufacturing a crystalline semiconductor film according to claim 7, wherein the second step is one in which a solution containing the metallic element is dripped onto the entire surface of the amorphous semiconductor film over the insulating substrate while the substrate is rotating.

12. A method of manufacturing a crystalline semiconductor film according to claim 7, wherein the metallic element is added by spinning using a solution containing one element or a plurality of elements, said element or said plurality of elements selected from the group consisting of Fe, Co, Ni, Ru, Rh, Pd, Os, Ir, Pt, Cu, and Au.

13. A method of manufacturing a crystalline semiconductor film containing silicon, said method comprising:
    providing an amorphous semiconductor film containing silicon over an insulating surface;
    providing a solution including a metallic element for promoting crystallization on a surface of the amorphous semiconductor film while rotating the insulating surface; and
    heating the amorphous semiconductor film to form the crystalline semiconductor film;
    wherein a rotational acceleration speed in rotating the insulating surface is from 5 to 120 rpm/sec.

14. A method of manufacturing a crystalline semiconductor film according to claim 13, wherein a substrate having the insulating surface has a square shape.

15. A method of manufacturing a crystalline semiconductor film according to claim 13, wherein the length of a diagonal of a substrate having the insulating surface is equal to or larger than 500 mm.

16. A method of manufacturing a crystalline semiconductor film according to claim 13, wherein the maximum value of a rotational velocity in rotating the insulating surface is from 800 to 1200 rpm.

17. A method of manufacturing a crystalline semiconductor film according to claim 13, wherein the solution containing the metallic element is dripped onto the surface of the amorphous semiconductor film over the insulating surface while the substrate is rotating.

18. A method of manufacturing a crystalline semiconductor film according to claim 13, wherein the metallic element is one element or a plurality of elements, said element or said plurality of elements selected from the group consisting of Fe, Co, Ni, Ru, Rh, Pd, Os, Ir, Pt, Cu, and Au.

19. A method of manufacturing a crystalline semiconductor film containing silicon, said method comprising:
    providing an amorphous semiconductor film containing silicon over an insulating substrate containing silicon;
    providing a solution including a metallic element for promoting crystallization on a surface of the amorphous semiconductor film while rotating the insulating surface; and
    heating the amorphous semiconductor film to form the crystalline semiconductor film;
    wherein a rotational acceleration speed y in rotating the insulating substrate satisfies $y=Ax^{-B}$ (where x is the diagonal dimension of the substrate, and A and B are constant).

20. A method of manufacturing a crystalline semiconductor film according to claim 19, wherein the insulating substrate has a square shape.

21. A method of manufacturing a crystalline semiconductor film according to claim 19, wherein the length of a diagonal of the insulating substrate is equal to or larger than 500 mm.

22. A method of manufacturing a crystalline semiconductor film according to claim 19, wherein the maximum value of a rotational velocity in rotating the insulating substrate is from 800 to 1200 rpm.

23. A method of manufacturing a crystalline semiconductor film according to claim 19, wherein the solution containing the metallic element is dripped onto the surface of the amorphous semiconductor film over the insulating substrate while the surface is rotating.

24. A method of manufacturing a crystalline semiconductor film according to claim 19, wherein the metallic element is a solution containing one element or a plurality of elements, said element or said plurality of elements selected from the group consisting of Fe, Co, Ni, Ru, Rh, Pd, Os, Ir, Pt, Cu, and Au.

* * * * *